(12) United States Patent
Li et al.

(10) Patent No.: US 11,281,113 B2
(45) Date of Patent: Mar. 22, 2022

(54) METHOD FOR DETERMINING STACK CONFIGURATION OF SUBSTRATE

(71) Applicant: ASML NETHERLANDS B.V., Veldhoven (NL)

(72) Inventors: Danying Li, Shenzhen (CN); Chi-Hsiang Fan, San Jose, CA (US); Abdalmohsen Elmalk, Eindhoven (NL); Youping Zhang, Cupertino, CA (US); Jay Jianhui Chen, Fremont, CA (US); Kui-Jun Huang, Shenzhen (CN)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/053,255

(22) PCT Filed: May 21, 2019

(86) PCT No.: PCT/EP2019/063053
§ 371 (c)(1),
(2) Date: Nov. 5, 2020

(87) PCT Pub. No.: WO2019/224176
PCT Pub. Date: Nov. 28, 2019

(65) Prior Publication Data
US 2021/0247701 A1 Aug. 12, 2021

Related U.S. Application Data

(60) Provisional application No. 62/675,918, filed on May 24, 2018.

(51) Int. Cl.
*G03F 7/20* (2006.01)

(52) U.S. Cl.
CPC ............... *G03F 7/70725* (2013.01)

(58) Field of Classification Search
CPC ............... G03F 7/7015; G03F 7/70633; G03F 7/70491; G03F 7/70725
(Continued)

(56) References Cited

U.S. PATENT DOCUMENTS 6,046,792 A 4/2000 Van Der Werf et al.
6,961,116 B2 11/2005 Den Boef et al.
(Continued)

FOREIGN PATENT DOCUMENTS

EP 2583056 4/2013
EP 3309617 4/2018
(Continued)

OTHER PUBLICATIONS

International Search Report and Written Opinion issued in corresponding PCT Patent Application No. PCT/EP2019/063053, dated Aug. 29, 2019.
(Continued)

*Primary Examiner* — Hung Nguyen
(74) *Attorney, Agent, or Firm* — Pillsbury Winthrop Shaw Pittman LLP

(57) ABSTRACT

A method for determining a stack configuration for a substrate subjected to a patterning process. The method includes obtaining (i) measurement data of a stack configuration with location information on a printed substrate, (ii) a substrate model configured to predict a stack characteristic based on a location of the substrate, and (iii) a stack map including a plurality of stack configurations based on the substrate model. The method iteratively determines values of model parameters of the substrate model based on a fitting between the measurement data and the plurality of stack configurations of the stack map, and predicts an optimum stack configuration at a particular location based on the substrate model using the values of the model parameters.

20 Claims, 27 Drawing Sheets

(58) Field of Classification Search
USPC .......................................... 355/52, 53, 55, 72
See application file for complete search history.

(56) References Cited

U.S. PATENT DOCUMENTS

| | | | |
|---|---|---|---|
| 10,191,391 B2* | 1/2019 | Pandey | ................ G03F 7/7015 |
| 2006/0066855 A1 | 3/2006 | Den Boef et al. | |
| 2011/0027704 A1 | 2/2011 | Cramer et al. | |
| 2011/0043791 A1 | 2/2011 | Smilde et al. | |
| 2012/0123748 A1* | 5/2012 | Aben | ...................... G03F 7/705 |
| | | | 703/2 |
| 2012/0242970 A1 | 9/2012 | Smilde et al. | |
| 2013/0124141 A1* | 5/2013 | Brill | ................... G01B 11/0625 |
| | | | 702/155 |
| 2015/0170355 A1* | 6/2015 | Yoshida | ............. G01N 21/9501 |
| | | | 382/145 |
| 2018/0069015 A1 | 3/2018 | Zhu et al. | |
| 2020/0356011 A1* | 11/2020 | Su | .......................... G06N 20/10 |

FOREIGN PATENT DOCUMENTS

| | | |
|---|---|---|
| WO | 2009078708 | 6/2009 |
| WO | 2009106279 | 9/2009 |
| WO | 2011158239 | 12/2011 |
| WO | 2018069015 | 4/2018 |

OTHER PUBLICATIONS

Edgar, T. et al.: "Model-based control in microelectronics manufacturing", Decision and Control, 1999. Proceedings of the 38th IEEE Conference in Phoenix, AZ, USA Dec. 7-10, 1999, IEEE, vol. 4, ISBN: 978-0-7803-5250, pp. 4185-4191 (Dec. 7, 1999).
Taiwanese Office Action issued in corresponding Taiwanese Patent Application No. 108116657, dated Jun. 16, 2020.

* cited by examiner

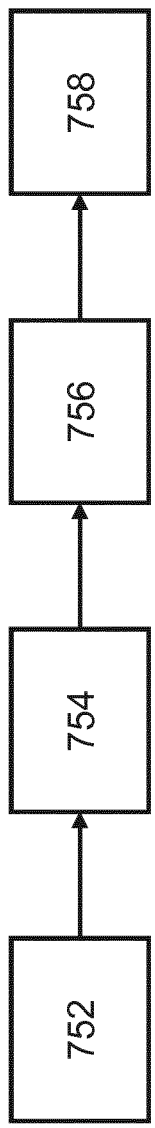

METHOD FOR DETERMINING STACK CONFIGURATION OF SUBSTRATE

CROSS-REFERENCE TO RELATED APPLICATIONS

This application is the U.S. national phase entry of PCT Patent Application No. PCT/EP2019/063053, which was filed on May 21, 2019, which claims the benefit of priority of U.S. patent application No. 62/675,918, which was filed on May 24, 2018, and which is incorporated herein in its entirety by reference.

TECHNICAL FIELD

The description herein relates generally to apparatus and methods of a patterning process and determining stack configuration and/or metrology target design.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment of the present disclosure, there is provided a method for determining a stack configuration for a substrate subjected a patterning process. The method includes obtaining (i) measurement data of a stack configuration with location information on a printed substrate, (ii) a substrate model configured to predict a stack characteristic based on a location of the substrate, and (iii) a stack map including a plurality of stack configurations based on the substrate model; determining, by a hardware computer system, values of model parameters of the substrate model based on a fitting between the measurement data and the plurality of stack configurations of the stack map; and predicting, by the hardware computer system, an optimum stack configuration at a particular location based on the substrate model using the values of the model parameters.

According to an embodiment, the substrate model includes one or more models corresponding to the stack characteristic of one or more layers of the substrate.

According to an embodiment, the substrate model is expressed in Cartesian coordinates having a first set of model parameters, and/or in polar coordinates having a second set of model parameters.

According to an embodiment, the second set of model parameters is associated with Zernike polynomials.

According to an embodiment, the stack configuration comprises a plurality of layers of the substrate, wherein each layer is associated with the stack characteristics.

According to an embodiment, the stack characteristic is a thickness of a layer of the substrate, a critical dimension of a feature of the substrate, and/or a distance between adjacent features of the substrate.

According to an embodiment, the stack characteristic is a difference in a thickness of a layer and a selected thickness of the layer.

According to an embodiment, the determining the values of the model parameters of the substrate model is an iterative process, an iteration includes generating the stack map having the plurality of stack configurations based on simulation of the substrate model and a patterning process; predicting intermediate values of model parameters based on an optimization algorithm; and fitting the measurement data and the plurality of stack configurations of the stack map such that a cost function is reduced.

According to an embodiment, the patterning process comprises a design for control process configured to automatically predict the stack configuration using the substrate model as perturbations.

According to an embodiment, the measurement data comprises a metrology recipe used for measurement of one or more stack characteristics of the stack configuration at the particular location on the substrate.

According to an embodiment, the method further includes converting measurement data from a Cartesian coordinates to polar coordinates using Zernike based conversion model.

Furthermore, according to an embodiment of the present disclosure, there is provided a method for determining optimum values of model parameters of a model configured to predict a characteristic of a patterning process. The method includes steps for obtaining (i) initial values including a starting point and a search region of the model parameters, (ii) measurement data corresponding to the characteristic of the patterning process, (iii) a predicted characteristic using the initial values of the model parameter and the measurement data, and (iv) an objective function, wherein the objective function comprises a first term related to a fit level, and a second term representing a penalty; and determining, by a hardware computer system, the values of the model parameter based on the starting point, the search region, the fit level between the model and the measurement data such that the objective function is reduced.

According to an embodiment, the characteristic of the patterning process is a stack characteristic.

According to an embodiment, the stack characteristic is a substrate thickness, a thickness deviation, an overlay, and/or an alignment.

According to an embodiment, the model is a substrate model representing the stack characteristic.

According to an embodiment, the substrate model has a parabolic form.

According to an embodiment, the search region is defined by a radius with the starting point as a center, wherein the radius is a distance from a center.

According to an embodiment, the fit level is a difference between a predicted characteristic and the measurement data.

According to an embodiment, the determining the values of the model parameter is an iterative process, wherein an iteration includes determining a number of sample points to be selected from the search region based on a number of model parameters and a size of the search region; fitting the model and the measurement data based on the selected sample points; determining a fit level based on the fitting; evaluating the objective function comprising the fit level; evaluating a fit quality based on the objective function; and updating the starting point and the search region based on the fit quality such that the objective function is reduced.

According to an embodiment, the updating the starting point and the search region comprises selecting a new starting point and increasing the search region, in response to the fit quality breaching a first threshold.

According to an embodiment, the updating the starting point and the search region comprises selecting a new starting point, in response to the fit quality breaching a second threshold.

According to an embodiment, updating the starting point and the search region comprises decreasing a size of the search region, in response to the fit quality breaching a third threshold.

According to an embodiment, the fitting is based on the objective function comprising a cost function of second order.

According to an embodiment, the objective function includes a first penalty term configured to maintain a positive value of coefficients of second order terms of the cost function; and/or a second penalty term associated with a distance between predicted characteristic and the measurement data.

Furthermore, according to an embodiment of the present disclosure, there is provided a computer program product comprising a non-transitory computer readable medium having instructions recorded thereon, the instructions when executed by a computer implementing the method of any of the above claims.

The foregoing general description of the illustrative implementations and the following detailed description thereof are merely exemplary aspects of the teachings of this disclosure, and are not restrictive.

BRIEF DESCRIPTION OF THE DRAWINGS

The above aspects and other aspects and features will become apparent to those ordinarily skilled in the art upon review of the following description of specific embodiments in conjunction with the accompanying figures, wherein:

FIG. 7C is a flow chart showing how the 'design for control' process chooses metrology target designs robust against process perturbations, according to an embodiment;

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

Figure 1:
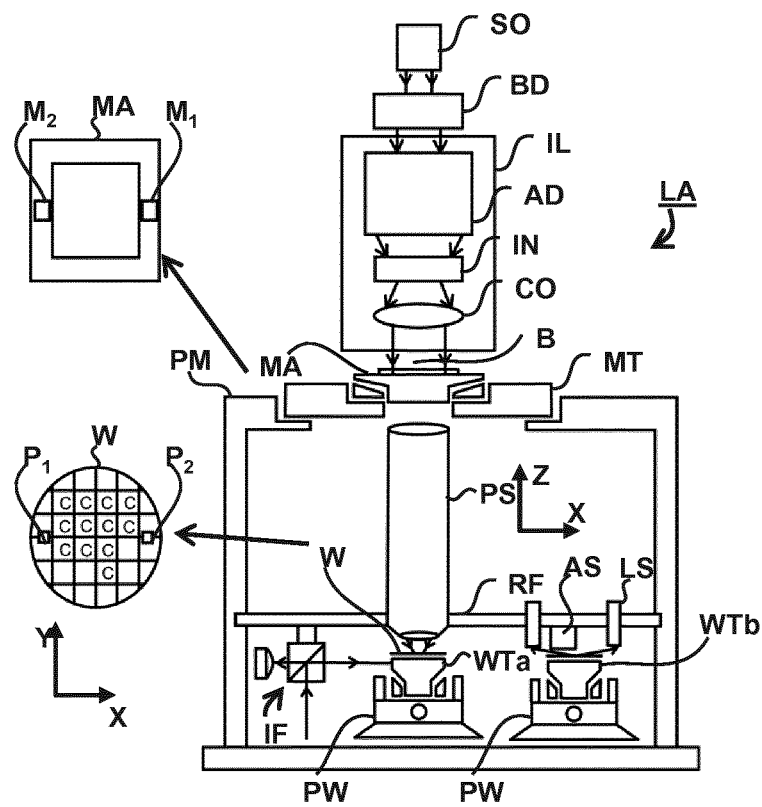
FIG. 1 schematically depicts a lithography apparatus, according to an embodiment.

FIG. 1 schematically depicts an embodiment of a lithographic apparatus LA. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
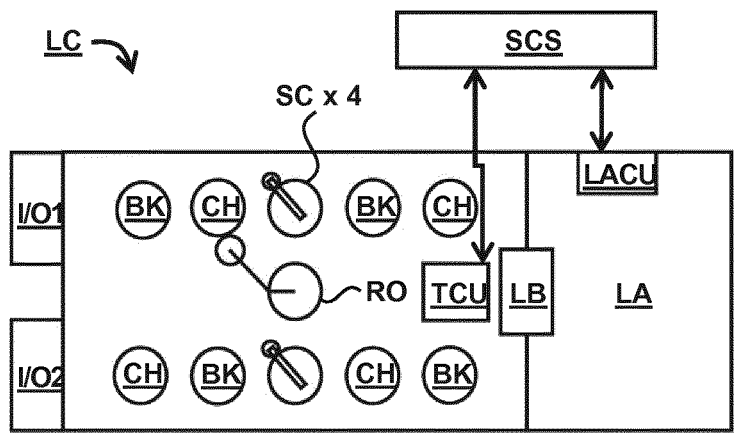
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1st orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3:
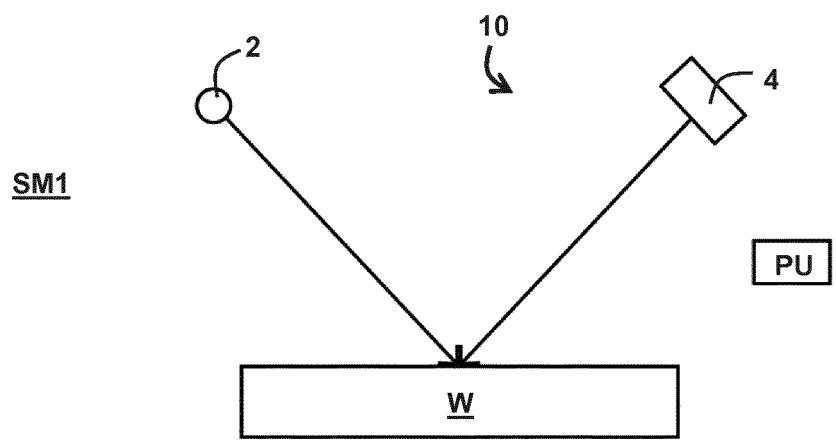
FIG. 3 schematically depicts an example inspection apparatus and metrology technique, according to an embodiment.
Figure 3:
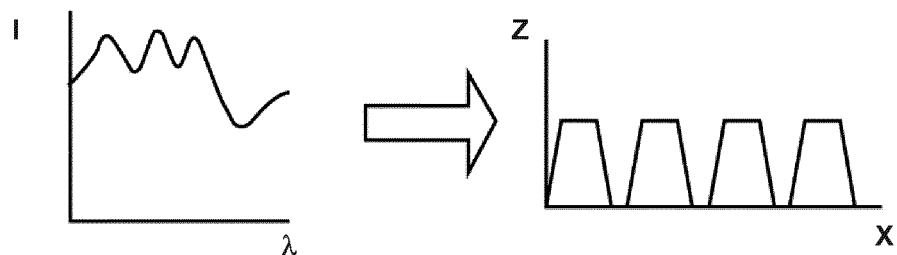

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left of FIG. 3. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
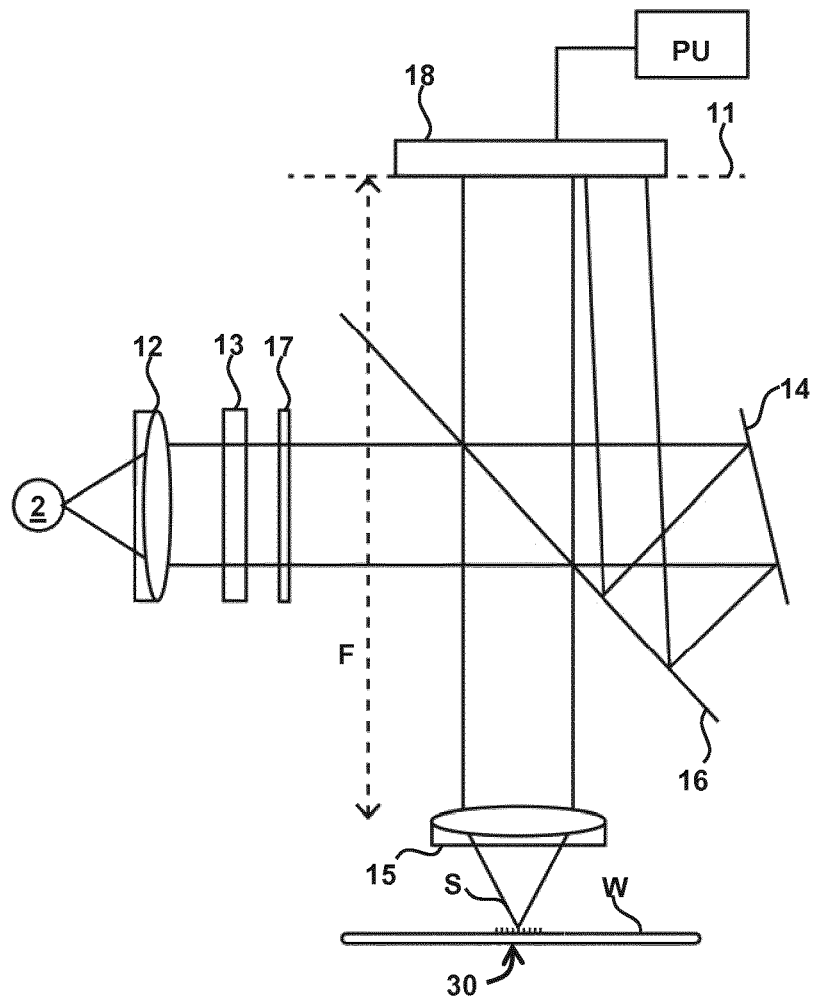
FIG. 4 schematically depicts an example inspection apparatus, according to an embodiment.

Another inspection apparatus that may be used is shown in FIG. 4. In this device, the radiation emitted by radiation source 2 is collimated using lens system 12 and transmitted through interference filter 13 and polarizer 17, reflected by partially reflecting surface 16 and is focused into a spot S on substrate W via an objective lens 15, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 15. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 16 into a detector 18 in order to have the spectrum detected. The detector 18 may be located at a back-projected focal plane 11 (i.e., at the focal length of the lens system 15) or the plane 11 may be re-imaged with auxiliary optics (not shown) onto the detector 18. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 16 part of it is transmitted through the partially reflecting surface 16 as a reference beam towards a reference mirror 14. The reference beam is then projected onto a different part of the same detector 18 or alternatively on to a different detector (not shown).

One or more interference filters 13 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 18 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, angle resolved scatterometry is useful in the measurement of asymmetry of features in product and/or resist patterns. A particular application of asymmetry measurement is for the measurement of overlay, where the target 30 comprises one set of periodic features superimposed on another. The concepts of asymmetry measurement using the instrument of FIG. 3 or FIG. 4 are described, for example, in U.S. patent application publication US2006-066855, which is incorporated herein in its entirety. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 18 may be an image sensor, such asymmetry in the diffraction orders appears directly as asymmetry in the pupil image recorded by detector 18. This asymmetry can be measured by digital image processing in unit PU, and calibrated against known values of overlay.

Figure 5:
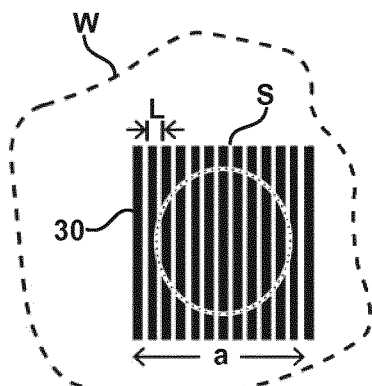
FIG. 5 illustrates the relationship between an illumination spot of an inspection apparatus and a metrology target, according to an embodiment.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 12, 13, 17 may be configured to provide illumination of a uniform intensity across a back focal plane of objective 15. Alternatively, by, e.g., including an aperture in the illumination path, illumination may be restricted to on axis or off axis directions.

Figure 6:
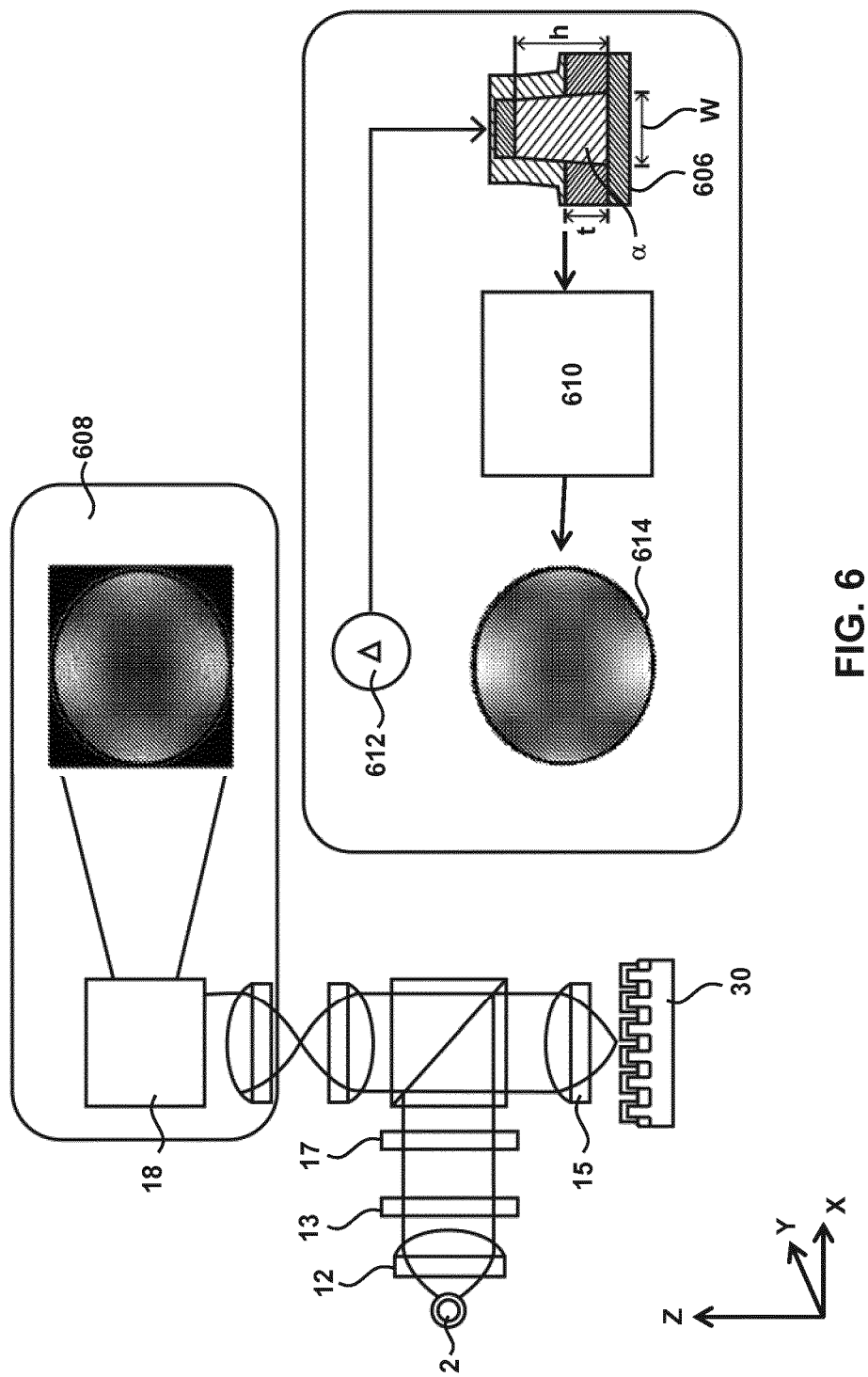
FIG. 6 schematically depicts a process of deriving a plurality of variables of interest based on measurement data, according to an embodiment.

FIG. 6 schematically depicts an example process of the determination of the value of one or more variables of interest of a target pattern 30' based on measurement data obtained using metrology. Radiation detected by the detector 18 provides a measured radiation distribution 608 for target 30'.

For a given target 30', a radiation distribution 612 can be computed/simulated from a parameterized model 606 using, for example, a numerical Maxwell solver 610. The parameterized model 606 shows example layers of various materials making up, and associated with, the target. The parameterized model 606 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 608 is then compared at 612 to the computed radiation distribution 612 to determine the difference between the two. If there is a difference, the values of one or more of the variables of the parameterized model 606 may be varied, a new computed radiation distribution 612 calculated and compared against the measured radiation distribution 608 until there is sufficient match between the measured radiation distribution 608 and the computed radiation distribution 612. At that point, the values of the variables of the parameterized model 606 provide a good or best match of the geometry of the actual target 30'. In an embodiment, there is sufficient match when a difference between the measured radiation distribution 608 and the computed radiation distribution 612 is within a tolerance threshold.

Figure 7A:
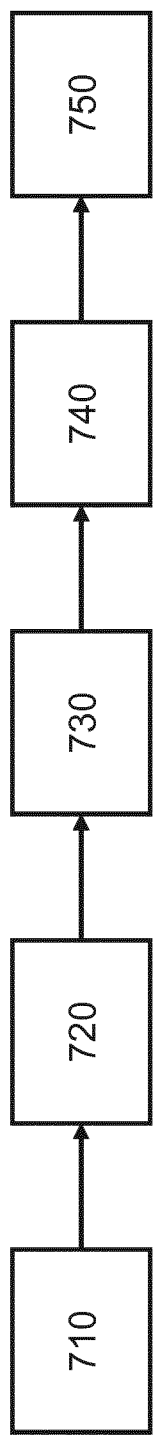
FIG. 7A is a flow chart showing various stages of a 'design for control' process flow, according to an embodiment.

FIG. 7A shows a flowchart that lists the main stages of the D4C method. In stage 710, the materials to be used in the lithography process are selected. The materials may be selected from a materials library interfaced with D4C through appropriate GUI. In stage 720, a lithography process is defined by entering each of the process steps, and building a computer simulation model for the entire process sequence. In stage 730, a metrology target is defined, i.e. dimensions and other characteristics of various features included in the target are entered into the D4C program. For example, if a grating is included in a structure, then number of grating elements, width of individual grating elements, spacing between two grating elements etc. have to be defined. In stage 740, the 3D geometry is created. This step also takes into account if there is any information relevant to a multi-layer target design, for example, the relative shifts between different layers. This feature enables multi-layer target design. In stage 750, the final geometry of the designed target is visualized. As will be explained in greater detail below, not only the final design is visualized, but as the designer applies various steps of the lithography process, he/she can visualize how the 3D geometry is being formed and changed because of process-induced effects. For example, the 3D geometry after resist patterning is different from the 3D geometry after resist removal and etching.

Figure 7B:
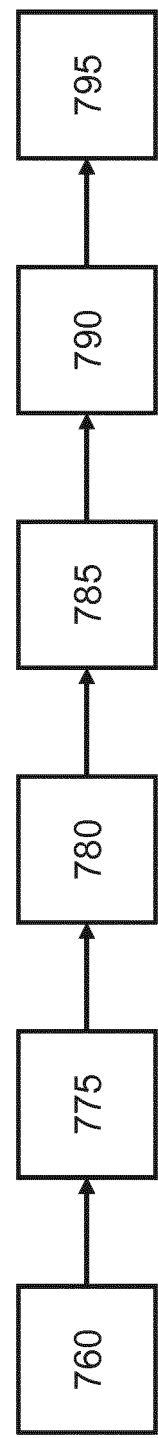
FIG. 7B is a block diagram showing various stages for visualization, according to an embodiment.

An important aspect of the present disclosure is that the target designer is enabled to visualize the stages of the method to facilitate their perception and control during modeling and simulation. Different visualization tools, referred to as "viewers," are built into the D4C software. For example, as shown in FIG. 7B, a designer can view material plots 760 (and may also get a run time estimation plot) depending on the defined lithography process and target. Once the lithography model is created, the designer can view the model parameters through model viewer tool 775. Design layout viewer tool 780 may be used to view the design layout (e.g., visual rendering of the GDS file). Resist profile viewer tool 785 may be used to view pattern profiles in a resist. Geometry viewer tool 790 may be used to view 3D structures on a substrate. A pupil viewer tool 795 may be used to view simulated response on a metrology tool. Persons skilled in the art would understand that these viewing tools are available to enhance the understanding of the designer during design and simulation. One or more of these tools may not be present in some embodiments of D4C software, and additional viewing tools may be there in some other embodiments.

FIG. 7C shows a flow chart that illustrates how the D4C process increases efficiency in the overall simulation process by reducing the number of metrology targets selected for the actual simulation of the lithography process. As mentioned before, D4C enables designers to design thousands or even millions of designs. Not all of these designs may be robust against variations in the process steps. To select a subset of target designs that can withstand process variation, a lithographer may intentionally perturb one or more steps of the defined lithography process, as shown in block 752. The introduction of the perturbation alters the entire process sequence with respect to how it was originally defined. Therefore, applying the perturbed process sequence (block 754) alters the 3D geometry of the designed target too. A lithographer only selects the perturbations that show non-zero alternations in the original design targets and creates a subset of selected process perturbations (block 756). The lithography process is then simulated with this subset of process perturbations (block 758).

The manufacturing or fabrication of a substrate using the lithographic process (or patterning process in general) typically involves process variations. The process variations are not uniform across the substrate. For example, in deposition process, films tend to be thicker at the center of the substrate and be thinner when close to edge. These systematic variations are usually reflected in measurements data as 'fingerprints', which are characteristics of a substrate based on known process conditions. In other words, there exists a stack on a substrate that has a spatial variation as a function of substrate coordinate. A stack comprises multiple layers formed on a substrate during the patterning process to form a selected pattern (e.g., a design pattern) on the substrate. Each layer of the stack can be associated with a thickness, material properties, and features and related parameters of the patterning process (e.g. CD, pitch, overlay, etc.).

According to the present disclosure, the stack is modeled to predict a stack configuration based on the location on a substrate such that the predicted stack configuration matches the measurement data of the stack configuration. The process of building the model and predicting the stack configuration using the model at a particular location is also referred as stack tuning or stack reconstruction. In other words, model parameters of the model are modified or tuned till an optimum stack configuration is generated. The existing strategy of stack tuning is based on using all measurements to tune one single stack, however such stack tuning does not match measurements in cases that involve substantial process variations at different locations across the substrate. Furthermore, conventionally, a stack tuning tool involves a field engineer or a computer scientist manually tuning an inaccurate stack by trial and error to match the metrology measurements. This is a manually intensive and error prone process that usually takes substantial amount of time but the outcomes are often not satisfying.

Stack-tuning/stack reconstruction/stack configuration is a challenging and demanding task in metrology applications (e.g., using scatterometer, or a Yield Star metrology tool). There are many factors that contribute to the non-ideal correlations between the metrology measurement and D4C simulation. These factors include, but are not limited to, inaccurate process stack information, inaccurate materials n, k information, system noise, process variations, etc. These factors make the interpretation of the measurement data and generating the metrology target design during a second time (e.g., in a subsequent substrate processing) a challenging task.

A reconstructed stack, which yields good correlations between measurement and simulation by considering the slight deviation of parameters of the patterning process from a selected value (e.g., nominal values related to CD, pitch, etc.), is highly desired to achieve simulation accuracy, expedited second time target design and yield improvement.

Figure 8:
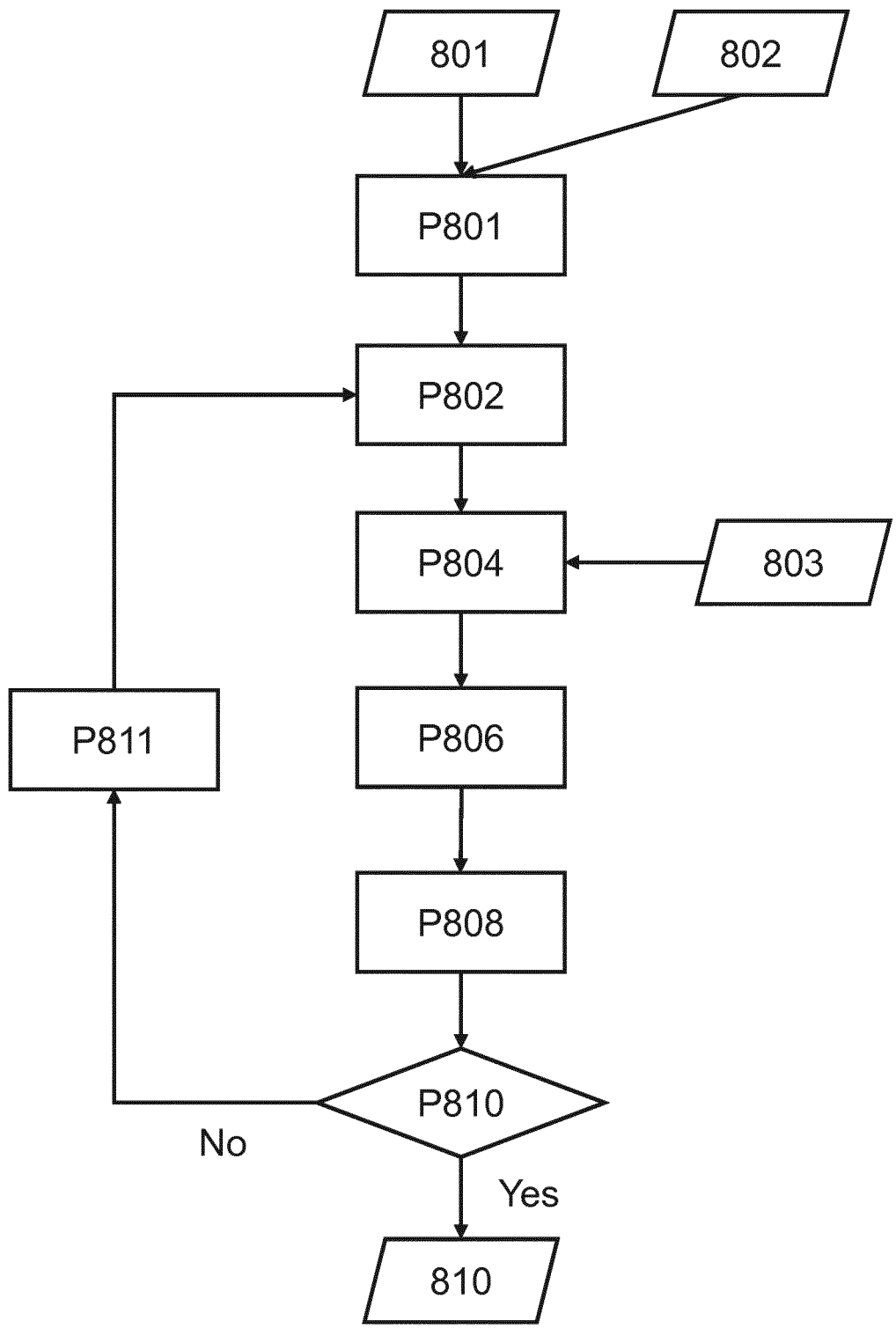
FIG. 8 is a flow chart of a method for determining a stack configuration of a substrate, according to an embodiment.

FIG. 8 is a method for determining a stack configuration at a particular location of a substrate subjected a patterning process. The method enables defining an optimum stack configuration by considering process variations across the substrate. The optimum stack configuration is based on a stack model that accounts for locations on a substrate and determines model parameters of the stack model in an iterative manner.

The terms "optimizing" and "optimization" as used herein refer to or mean adjusting values of the model parameters of the model of a stack characteristic that is further used to define the stack configuration. In an embodiment, adjusting may be of an apparatus and/or process of the patterning process, which may include adjusting a lithography process or apparatus, or adjusting the metrology process or apparatus (e.g., the target, measurement tool, etc.), such that a figure of merit has a more desirable value, such as patterning and/or device fabrication results and/or processes (e.g., of lithography) have one or more desirable characteristics, projection of a design layout on a substrate being more accurate, a process window being larger, etc. Thus, optimizing and optimization can also refer to or mean a process that identifies one or more values for one or more design variables (e.g., stack characteristics or a corresponding stack configuration) that provide an improvement, e.g., a local optimum, in a figure of merit, compared to an initial set of values of the design variables. "Optimum" and other related terms should be construed accordingly. In an embodiment, optimization steps can be applied iteratively to provide further improvements in one or more figures of merit.

The method, in process P801, includes obtaining (i) measurement data 801 of a stack configuration with location information of a stack characteristic on a printed substrate, and (ii) a substrate model 803 configured to predict a stack characteristic based on a location of the substrate. In an embodiment, user inputs 802 (e.g., initial values of model parameters of the substrate model) may also be obtained to initiate the substrate model 803. In an embodiment, a substrate map may be obtained and/or generated (as discussed in process P804).

A stack configuration refers to an arrangement of different layers relative to each other that may be formed on the substrate during the patterning process. In an embodiment, the stack configuration includes a plurality of layers and information related to each layer. For example, each layer may be associated with a geometry, a material, or other information. In an embodiment, each layer is associated with a layer thickness, one or more feature on the layer, a location of the stack on the substrate, and/or material information (e.g., n, k values) of the layer, relative position of the layer with respect to other layers, etc.

The stack configuration may be defined in terms of one or more stack characteristics. The stack characteristic may be a parameter of the substrate related to the feature, the geometry, or the material of the substrate. In an embodiment, the stack characteristic may be a thickness of a layer of the substrate, a critical dimension of a feature of the substrate, and/or a distance between adjacent features of the substrate. In an embodiment, the stack characteristic is a difference in thickness of the layer and a selected thickness of the layer (e.g., a nominal thickness of the layer, an average thickness of the layer, or an intended design thickness). In an embodiment, the stack characteristic can be a measured, simulated, and/or a derived parameter.

Figure 9A:
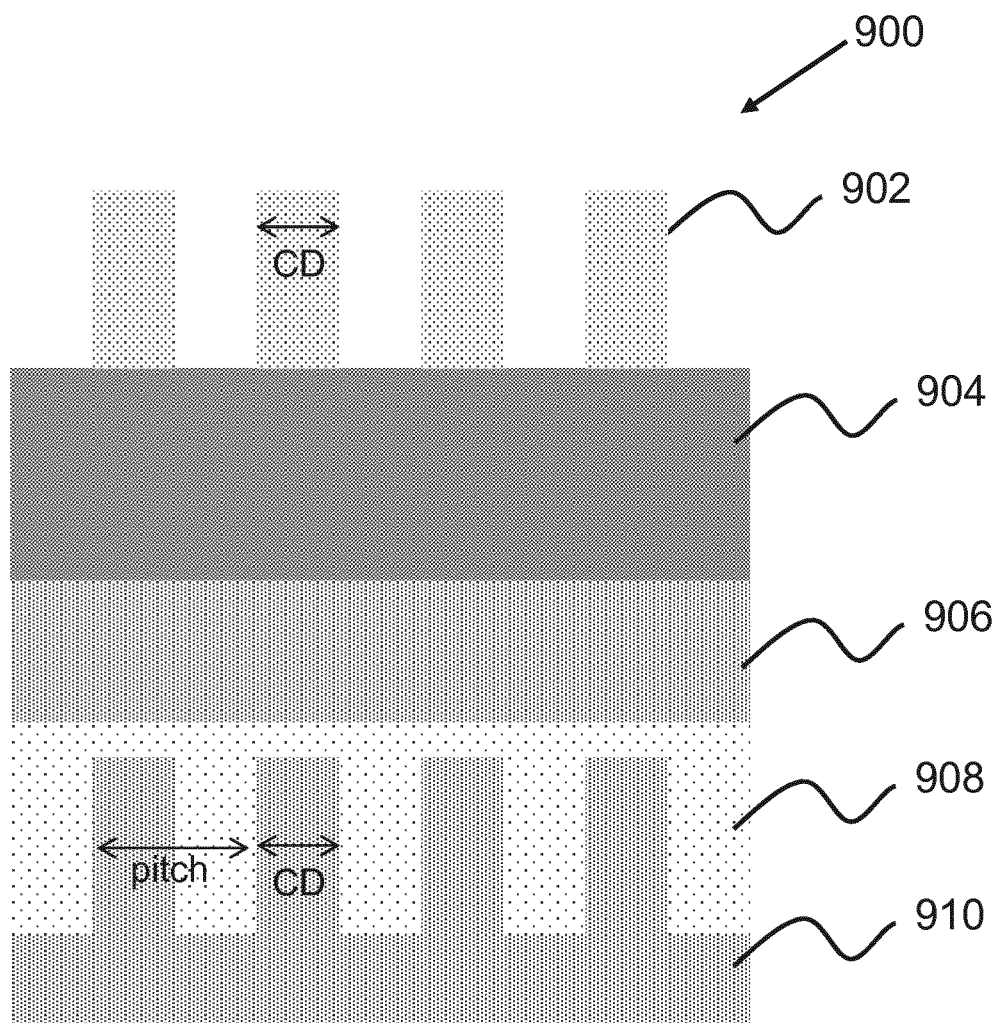
FIG. 9A illustrates an example stack configuration, according to an embodiment.
Figure 9B:
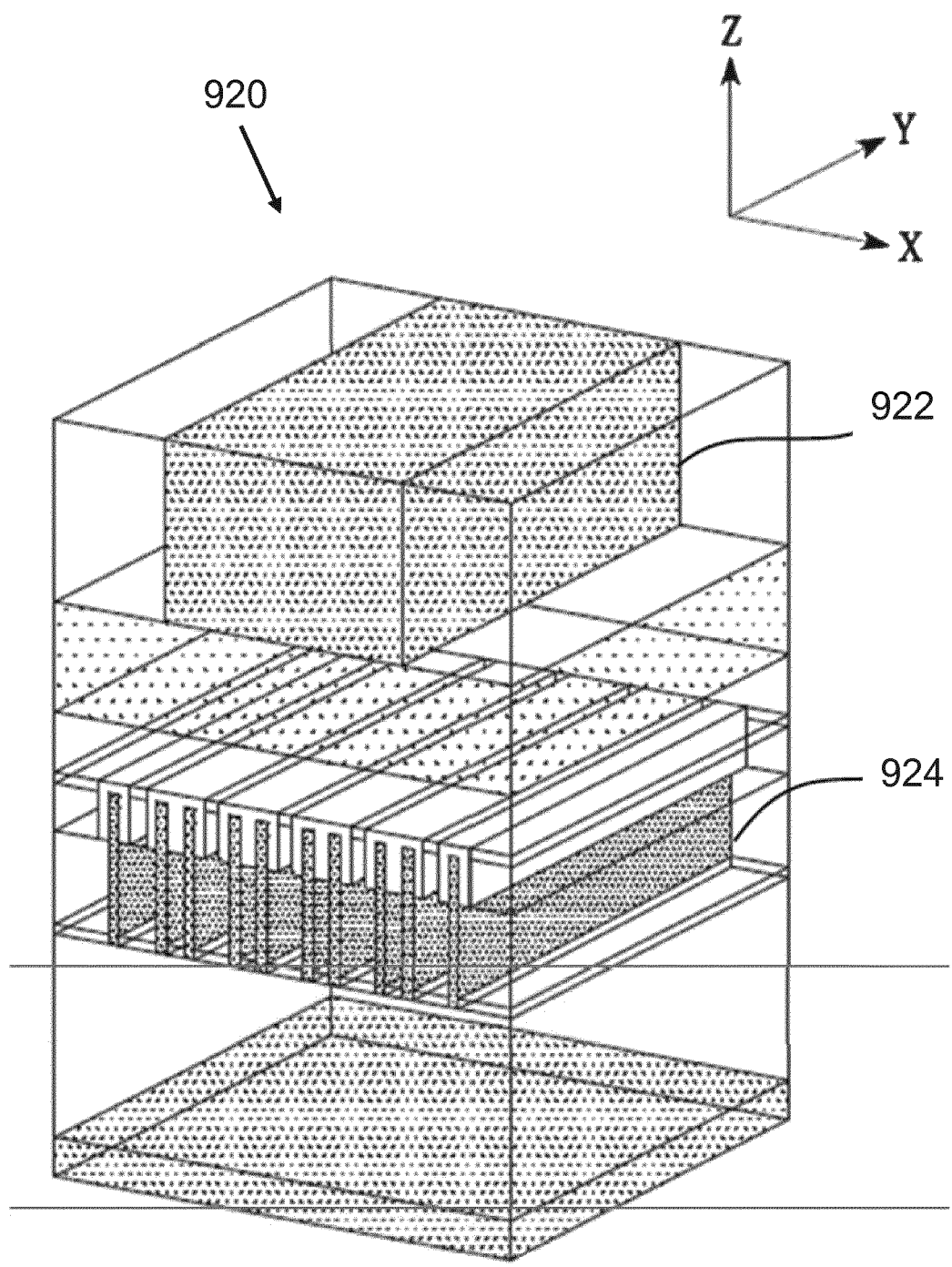
FIG. 9B illustrates another example stack configuration, according to an embodiment.

FIGS. 9A and 9B illustrate example stack configurations. FIG. 9A is a cross-section of an example stack configuration 900 including different layers, features, etc. and FIG. 9B is a three dimensional representation of a stack configuration 920. In FIG. 9A, the stack configuration 900 includes layers 902, 904, 906, 908, 910, etc. formed during the various steps of the patterning process. For example, the layer 902 may be a resist layer (or an etch layer), the layer 904 may be an oxide layer made of a first oxide (e.g., SOH based) formed by deposition, the layer 906 may be a second oxide layer (e.g., amorphous silicon oxide based), the layer 910 may be a etch layer, etc. Furthermore, each layer has different properties such as a material property, geometric property such as a thickness, which can be measured, for example, using a metrology tool as discussed earlier, etc. In an addition, each layer may include one or more features having characteristics such as a CD, pitch, etc., which may also be measured using the metrology tool. The measurements from the metrology tool may be included in one or more items of measurement data.

In an embodiment, as shown in FIG. 9B, a more complex device structures such as a FinFET array may be determined that requires several layers of materials and several process steps. In such structures, overlay control may be the parameter of interest that may be optimized during the stack reconfiguration. For example, a top electrode layer 922 is aligned with respect to the array of fins 924 in a layer which is not necessarily adjacent to the top electrode layer. Stack reconfiguration using D4C simulation allows to define spatial and other characteristic relationship between features from different layers.

The measurement data 801 is related to one or more stack characteristics of the printed substrate that may be obtained from metrology tools (e.g., scatterometer, interferometer, etc.), as discussed earlier in the present disclosure. In an embodiment, the measurement data 801 includes information related to the stack configuration at a particular location on the substrate. For example, measurement data 801 can include a plurality of stack characteristics such as a thickness information of a first layer (e.g., an etch layer), a second layer (e.g., an amorphous silicon oxide layer), a third layer (spin-on hard mask layer), a fourth layer (e.g., photo resist layer), and so on at each of the locations P1, P2, P3, P4, P5, etc. These locations are spread across the substrate. The locations may be identified in the form of Cartesian coordinates (x,y) or polar coordinates (r, θ). In an embodiment, the measurement data may be converted from a Cartesian coordinates to polar coordinates using, for example, geometric correlation between Cartesian to polar conversions, and/or using a Zernike based conversion model. The Zernike based conversion model uses Zernike polynomials which enables capture of variation in thickness across the substrate as such variation tends to be radially symmetric while Zernike polynomials are well-suited to describing radially symmetric systems.

Additionally, a metrology recipe data such as a setting of the metrology tool (e.g., Yieldstar, scatterometer, etc.) may be obtained or included in the measurement data 801. The recipe data includes, for example, wavelength, polarization, light source intensity, etc. The recipe data can also be associated with a location on the substrate. The recipe can be associated with a stack characteristic of the stack configuration at a particular location. Thus, appropriate recipe may be selected during the metrology to obtain accurate measurements of a metrology target (or features) on the substrate.

The substrate model 803 is a mathematical model related to a stack characteristic (e.g., overlay, thickness, sidewall angle, etc.) defined in terms of a location on a substrate. The substrate model 803 includes a plurality of model parameters or tuning parameters, which can be tuned based on the measurement data, according the method of present disclosure. In an embodiment, the substrate model 803 may be a statistical model, for example, a linear regression model, a second order (e.g., having second order terms) model, or other higher order regression model. In an embodiment, the substrate model 803 may be a collection of mathematical models defined for each of the stack characteristics.

In an embodiment, the substrate model 803 (e.g., represented by equations 1 and 2) may be a thickness based model in Cartesian coordinates having a first set of model parameters (also referred as tuning parameters) and a second set of model parameters, defined as follows:

$$\Delta t_A = k_{A1} + k_{A7} * (x^2 + y^2) \tag{1}$$

$$\Delta t_B = k_{B1} + k_{B7} * (x^2 + y^2) \tag{2}$$

In the above equations 1 and 2, $\Delta t_A$ is a difference in thickness of a first layer (layer A) and a nominal thickness of the first layer, $\Delta t_B$ is a difference in thickness of a second layer (layer B) and a nominal thickness of the second layer, $k_{A1}$ and $k_{A7}$ are tuning parameters of the first substrate model, $k_{B1}$ and $k_{B7}$ are tuning parameters of the second substrate model, and x and y are the Cartesian coordinates corresponding to each of the locations such as P1, P2, P3, P4, P5, etc. across the substrate. Thus, the location-specific value of the stack characteristic may be determined. The substrate model 803 may be evaluated for all locations on a substrate and the tuning parameters may be determined based on the measurement data 801 an objective function. After the tuning process or optimization process, the tuning parameters will have specific values based on which a thickness of a layer at any location may be determined with high accuracy, as such improving accuracy of the metrology tool.

In an embodiment, the substrate model 803 may be based on an overlay, an alignment and/or a sidewall angle of features of the substrate. Furthermore, the substrate model 803 may include different terms and associated model parameters. Each term may be associated with an aspect of the patterning process. Accordingly, the substrate model 803 may include terms such as a substrate leveling term to mimic a translation operation and/or rotation (e.g., in x or y direction), magnification terms (e.g., in x or y direction) corresponding to a lens of the optical system, scanning directions/patterns (e.g., in x or y direction) terms using a lens, bow factors terms of the lens, a third order magnification factor related terms, C-shape distortion terms, etc. Each term may be described in terms of x-y location on a substrate. Further each term may be associated (e.g., multiplied) with a model parameter (e.g., k1, k2, k3, k4, k5, k6, etc.). At the end of the iterations of the present method, optimized values of the parameters k1, k2, k3, k4, etc. are obtained that enables accurate prediction of the stack characteristic (e.g., thickness, overlay, alignment) and the stack configuration.

In an embodiment, the substrate model 803, which may be a radius based model (e.g., represented by equations 3 and 4) may be expressed in polar coordinates and model parameters as Zernike polynomials. These model parameters are referred as a second set of model parameters, as shown in equations 2-4 below. Thus, the second set of model parameters captures process variations in the form of Zernike polynomials. Such substrate model 803 may be applied to account for process variations due to, for example, deposition, etching, CMP, etc. that leave a strong radial fingerprint (e.g., variation in thickness, overlay or alignment characteristics across the entire substrate). An example, thickness based substrate model 803 is described as follows:

$$\Delta t_A = Z_{A1} + Z_{A4} \times R^2 \quad (3)$$

$$\Delta t_B = Z_{B1} + Z_{B4} \times R^2 \quad (4)$$

In the above equations 3 and 4, $\Delta t_A$ is a difference in thickness of a first layer (layer A) and a nominal thickness of the first layer, $\Delta t_B$ is a difference in thickness of a second layer (layer B) and a nominal thickness (e.g., a desired thickness, or a thickness provided by a user/designer) of the second layer, $Z_{A1}$ and $Z_{A7}$ are tuning parameters of the third substrate model, $Z_{B1}$ and $Z_{B7}$ are tuning parameters of the fourth substrate model, and R is the radial distance on the substrate. The substrate model 803 may be evaluated for all locations on a substrate and the tuning parameters may be determined based on the measurement data 801 and the objective function that includes a cost function (e.g., a second order polynomial, RMS, MSE, etc.).

In an embodiment, the substrate model 803 that is expressed in polar coordinates including radius r and Zernike polynomial may be a set of equations such as the equations 5-8 as follows:

$$r = \sqrt{x^2 + y^2} \quad (5)$$

$$f1 = 1 \quad (6)$$

$$f4 = 2r^2 - 1 \quad (7)$$

$$\Delta thickness = Z1 \cdot f1 + Z4 \cdot f4 \quad (8)$$

The above substrate model may account for process variations in terms of Zernike polynomials, thus enabling the substrate model to predict more accurate stack characteristics (and stack configuration) compared to a conventional methods in which process variation is not taken into account and the stack characteristic (e.g., thickness of a layer) is considered as a constant at different locations on the substrate.

In process P802, the tuning parameters may be initialized based on user inputs 802. In an embodiment, the initial values and/or modified values (i.e., the initial values modified during the iterative process) may be determined based on, for example, a Monte Carlo based sampling of the values of the model parameters. In an embodiment, such Monte Carlo sampling may be based on an optimization algorithm that determines a sample size based on a search space and an objective function to be reduced, discussed later in the disclosure. It can be appreciated by a person skilled of ordinary skill in the art that the space of model parameters may be very large and finding the most appropriate values is highly challenging and computationally intensive. For example, each layer may be associated with a different substrate models based on the stack characteristics (e.g., more than 3) each associated with multiple model parameters (e.g., 2 per stack characteristic). Furthermore, the substrate may include a large number of layers (e.g., more than 10). Furthermore, each model parameter may take any values in infinite space. Thus, selection of appropriate values of the model parameter and/or determination of optimum model parameter values is not trivial.

Furthermore, in process P804, the method involves generating, via simulation of the substrate model 803 and design for control simulation, a stack map including a plurality of stack configurations, where each stack configuration is associated with a particular location on the substrate. In process P804, the values of tuning parameters determined in the process P802 may be used in the equations discussed above, along with a x-y location values (e.g., a center of the substrate (i.e., 0,0), at an edge of the substrate (e.g., 8 mm, 6 mm), etc.). Thus, based on the locations, different stack characteristics (and corresponding stack configurations) may be determined. Depending on the stack characteristic used, each stack configuration includes specific stack characteristics (e.g., thickness, CD, pitch, etc.) and related values. In an embodiment, the stack configuration at each location (e.g., P1, P2, P3, P4, etc.) includes a thickness of each layer, a critical dimension (CD) of a feature on each layer, an overlay between each layer, etc.

Figure 10:
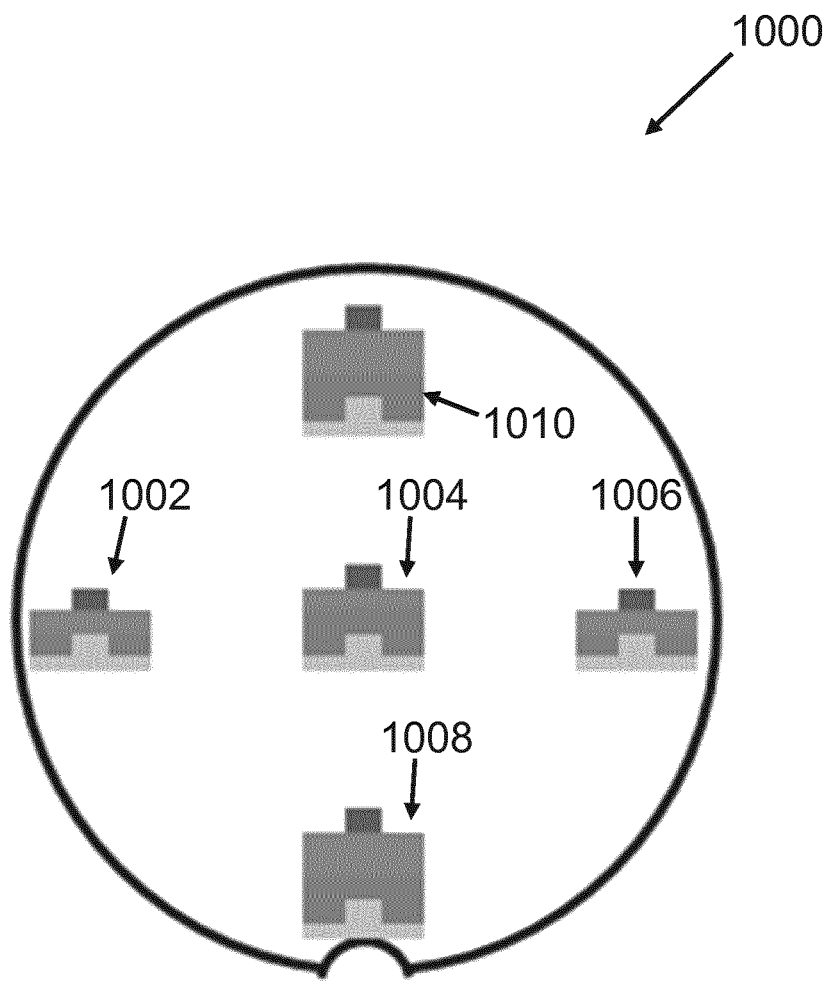
FIG. 10 illustrates an example stack map on a substrate, according to an embodiment.
Figure 11A:
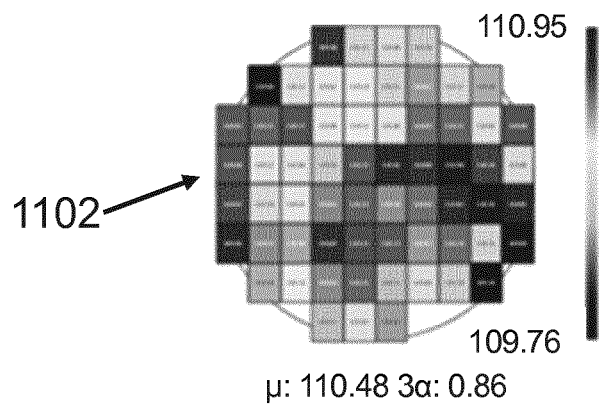
FIG. 11A illustrates a fingerprint of an example layer of a substrate, according to an embodiment.
Figure 11B:
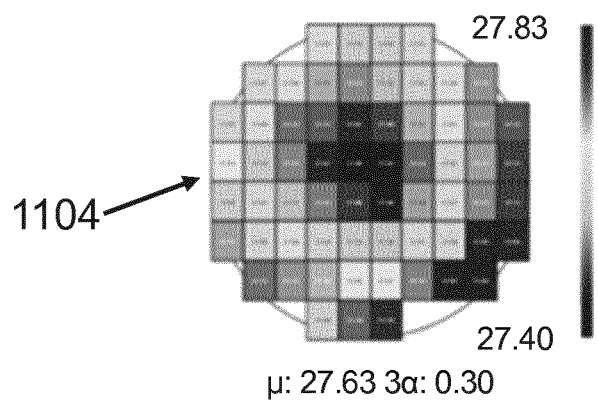
FIG. 11B illustrates another fingerprint of an example layer of a substrate, according to an embodiment.
Figure 11C:
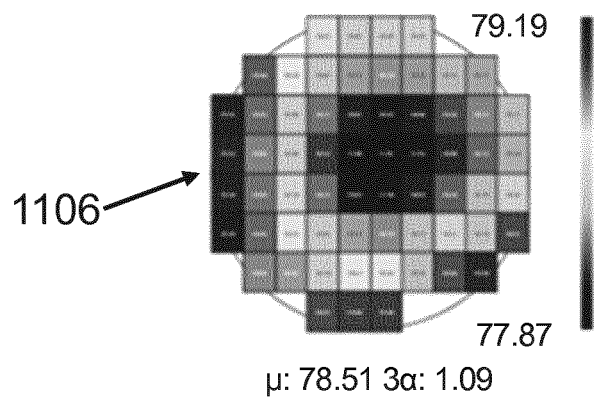
FIG. 11C illustrates another fingerprint of an example layer of a substrate, according to an embodiment.
Figure 11D:
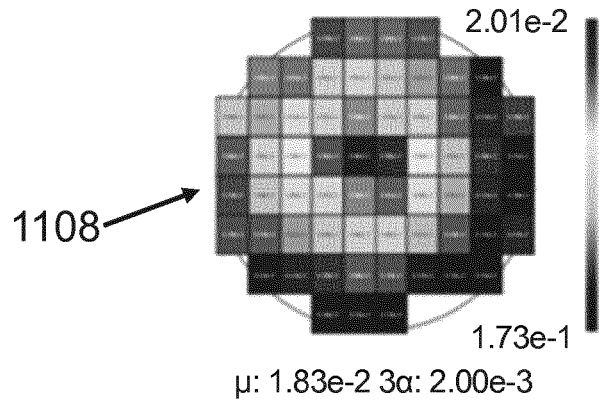
FIG. 11D illustrates a residual fingerprint of a substrate, according to an embodiment.

FIG. 10 illustrates an example stack map 1000 including five stack configurations 1002, 1004, 1006, 1008, and 1010 at different locations P1, P2, P3, P4, and P5, respectively, on an example substrate 1001. Each position may be measured in terms of Cartesian coordinates or polar coordinates. Such location information is later used in the process to determine a fit between the stack model 803 and the measurement data. In an embodiment, the stack configuration 1002, 1004, 1006, 1008, and 1010 may have different stack characteristic due to process variations across the substrate. When the stack configuration is determined based on such varied stack characteristics, the model parameters (k1, k2, k3, etc.) determined at the end of the optimization process of the present method provide the stack model that is capable of accounting for process variations across the substrate.

Furthermore, in process P806, the stack characteristics (e.g., the delta values $\Delta t_A$, $\Delta t_B$, etc.) may be used as perturbations in a simulation of a patterning process (e.g., D4C) to determine the stack configuration or a geometry of a metrology target at different locations. In an embodiment, as discussed with respect to FIGS. 7A-7C, in the D4C method individual steps of a lithography process are modeled into a single process sequence to simulate the physical substrate processing. That process sequence drives the creation of the device geometry (e.g., stack configuration) as a whole, rather than "building" the device geometry element-by-element. This is different from conventional approaches that use purely graphical volume elements in a three-dimensional schematic editor to build metrology targets. In an embodiment, the process P806 may further modify the tuning parameters of the substrate model 803 to determine the stack configuration. In an embodiment, the processes P804 and P806 may be executed in tandem or together to determine the stack map.

The method, in process P808, determining the values of the model parameters based on a fitting between stack configuration of process P806 and the measurement data such that a cost function (e.g., an objective function) is reduced. An example cost function is discussed in detail later in the disclosure. In an embodiment, the cost function may be a mean square error (MSE), a root mean squared error (RMS), or any other appropriate statistical metric that determines a difference between the simulated values of the stack configuration and the measurement data. In an embodiment, the fitting process may involve modifying the tuning parameters of the substrate model 803 such that the cost function is reduced (in an embodiment, minimized). The fitting may be an iterative process, where model parameters of the stack model are iteratively determined so that the stack model is fitted with the measurement data with high accuracy. In other words, the fitted stack model is highly correlated with the measurement data (e.g., as shown in FIGS. 12A-12E).

Further, in process P810, a determination is made whether a stop criterion is satisfied (e.g., a value of cost function breaches a threshold) or a number of selected iterations is reached. If the stop criterion is not satisfied, in process P812, an optimization algorithm is executed to determine a next set of value of the model parameter (or intermediate parameter values) from the parameter space to be used in the next iteration of the method. In an embodiment, the optimization algorithm may be based on a gradient-based method (e.g., a gradient descent method), where a gradient of the cost function is evaluated and the values of the model parameter that reduces or minimizes the cost function is selected. In an embodiment, the optimization algorithm may be a model-based trust region global optimization algorithm.

As an example, a cost function used to optimize stack characteristics and the stack configuration is expressed in equation 9 below:

$$CF(z_1, z_2, \ldots, z_N) = \sum_{p=1}^{P} w_p f_p^2(z_1, z_2, \ldots, z_N) \quad (9)$$

In equation 9, $(z_1, z_2, \ldots, z_N)$ there are N design variables (e.g., stack characteristics) or values thereof. In an embodiment, $f_p(z_1, z_2, \ldots, z_N)$ can be a function of the design variables $(z_1, z_2, \ldots, z_N)$, such as a metric characterizing the degree of matching between the result (e.g., thickness, sidewall angle, overlay, alignment, focus) of a particular target design (e.g., a stack configuration) as measured using a particular substrate measurement recipe and the one or more patterns of one or more functional devices, for a set of values of the design variables of $(z_1, z_2, \ldots, z_N)$. $f_p(z_1, z_2, \ldots, z_N)$ can be a metric (e.g., a key performance indicate) characterizing the performance (e.g., detectability, printability, sensitivity, stability, etc.) of a particular target design in combination with an associated substrate measurement recipe. In an embodiment, $f_p(z_1, z_2, \ldots, z_N)$ can be a metric characterizing the detectability of the particular target design with its associated substrate measurement recipe, namely a measure of the ability of the measurement apparatus and process to detect and measure the particular target design with its associated substrate measurement recipe. In an embodiment, $f_p(z_1, z_2, \ldots, z_N)$ can be a metric characterizing the stability of measurement using the particular target design with its associated substrate measurement recipe, namely how much the result of the measurement of the particular target design with its associated substrate measurement recipe varies under perturbation. So, in an embodiment, $CF(z_1, z_2, \ldots, z_N)$ is a combination of a $f_p(z_1, z_2, \ldots, z_N)$ characterizing a degree of matching between the result (e.g., a layer thickness, sidewall angle, overlay, alignment, focus) of a particular target design as measured using a particular substrate measurement recipe and the behavior of one or more patterns of one or more functional devices and performance a $f_p(z_1, z_2, \ldots, z_N)$ characterizing the detectability of the particular target design with its associated substrate measurement recipe. $w_p$ is a weight constant associated with $f_p(z_1, z_2, \ldots, z_N)$ and of course, could have different values for different $f_p(z_1, z_2, \ldots, z_N)$. Of course, $CF(z_1, z_2, \ldots, z_N)$ is not limited to the form in Eq. 9. $CF(z_1, z_2, \ldots, z_N)$ can be in any other suitable form.

Thus, in an embodiment, the cost function can include both performance indicators of device pattern matching and target detectability. In an embodiment, the cost function can be the same, or similar in form to, the following:

$$\text{Cost Function} = \sqrt{(W1 * PI_{device\ matching})^2 + (W2 * PI_{detectability})^2} + \quad (10)$$
$$\text{Penalty function } (PI_{device\ matching}, PI_{detectability})$$

In equation 10 above, $PI_{device\ matching}$ is the performance indicator for device pattern matching, $PI_{detectability}$ is the performance indicator for target detectability, and W1 and W2 are weighting coefficients. With this format, both device pattern matching and target detectability are co-optimized mathematically. If better device pattern matching is desired, then W1 would be larger than W2, for example.

In an embodiment, the cost function for $PI_{detectability}$ comprises $\sqrt{TC^2 + 1/SS^2}$ wherein TC is target coefficient and SS is stack sensitivity.

In one embodiment, the design variables $(z_1, z_2, \ldots, z_N)$ comprise one or more characteristics/parameters of the target. For example, the design variables can include one or more geometric characteristics (e.g., pitch of features of a periodic structure of the target, CD of a feature of a periodic structure of the target (e.g., the widths of the exposed portions and/or unexposed portions), segmentation of individual features of a periodic structure of the pattern, shape of at least part of a periodic structure, length of a periodic structure or of a feature of the periodic structure, etc.) and/or one or more materials properties (e.g., refractive index of a layer of the target, extinction coefficient of a layer of the target, etc.). In an embodiment, the design variables include a plurality of characteristics/parameters of the target. In an embodiment, the design variables can include any adjustable parameters of the substrate measurement recipe. For example, the design variables ($z_1, z_2, \ldots, z_N$) may include wavelength, polarization, and/or pupil shape specified in the substrate measurement recipe.

In an embodiment, the stack tuning may also include a process to optimize a target and/or substrate measurement recipe to make the result thereof match one or more patterns of a functional device on the substrate. Some or all of the parameters of the target and/or substrate measurement recipe may be adjusted in the optimization. For example, one or more parameters of the target and/or one or more parameters of the measurement may be adjusted. The optimization may use a cost function that represents a metric characterizing the degree of matching between the result (e.g., overlay, alignment, focus) of using a particular target design in combination with a substrate measurement recipe and the one or more patterns of one or more functional devices. As noted above, the result of measuring a target (of a particular design) using a substrate measurement recipe may be simulated. Thus, in an embodiment, the metric may be a difference between the result and the measurement. The cost function may further represent or be constrained by the performance (e.g., detectability of the target, printability of the target, measurement sensitivity of the target, stability of measurement) of the target in combination with an associated substrate measurement recipe. Stability is how much the result of using the substrate measurement recipe to make a measurement with a target varies under a perturbation.

According to an embodiment, the optimization process of stack configuration boils down to a process of finding a set of model parameters of the substrate model 803 that optimizes (e.g., minimizes or maximizes) the cost function. The cost function can have any suitable form depending on the goal of the optimization. For example, the cost function can be weighted root mean square (RMS) of deviations of certain characteristics of the process and/or system with respect to the intended values (e.g., ideal values) of these characteristics; the cost function can also be the maximum of these deviations (i.e., worst deviation). The design variables can be confined to finite ranges and/or be interdependent due to practicalities of implementations of the process and/or system. In the case of a patterning process, the constraints are often associated with physical properties and characteristics of the hardware and/or patterning step, such as tunable ranges of hardware and/or patterning device manufacturability design rules.

Physically, the (mis)matching (e.g., overlay shift) is mostly induced by optical aberrations when printing the device and the target on the substrate. How the target is measured (e.g., the target's detection by a measurement apparatus) will not affect how much the target is shifted. On the other hand, the detectability of the target is determined by the interaction between upper and lower periodic structures of the target (for an overlay target) or to the interaction between the target periodic structure and a sensor (for an alignment target). So, a shift introduced by aberrations usually has little or no impact on the detectability if the target is in the region of good detectability. So, these two effects are somewhat independent of each other, except that both will be influenced by the target's characteristics in terms of geometry, materials property, etc. So, changing a target characteristic could have a large impact to one metric but have little impact to another. So, in an embodiment, having consideration of these properties, an optimizer can find a solution.

Figure 14:
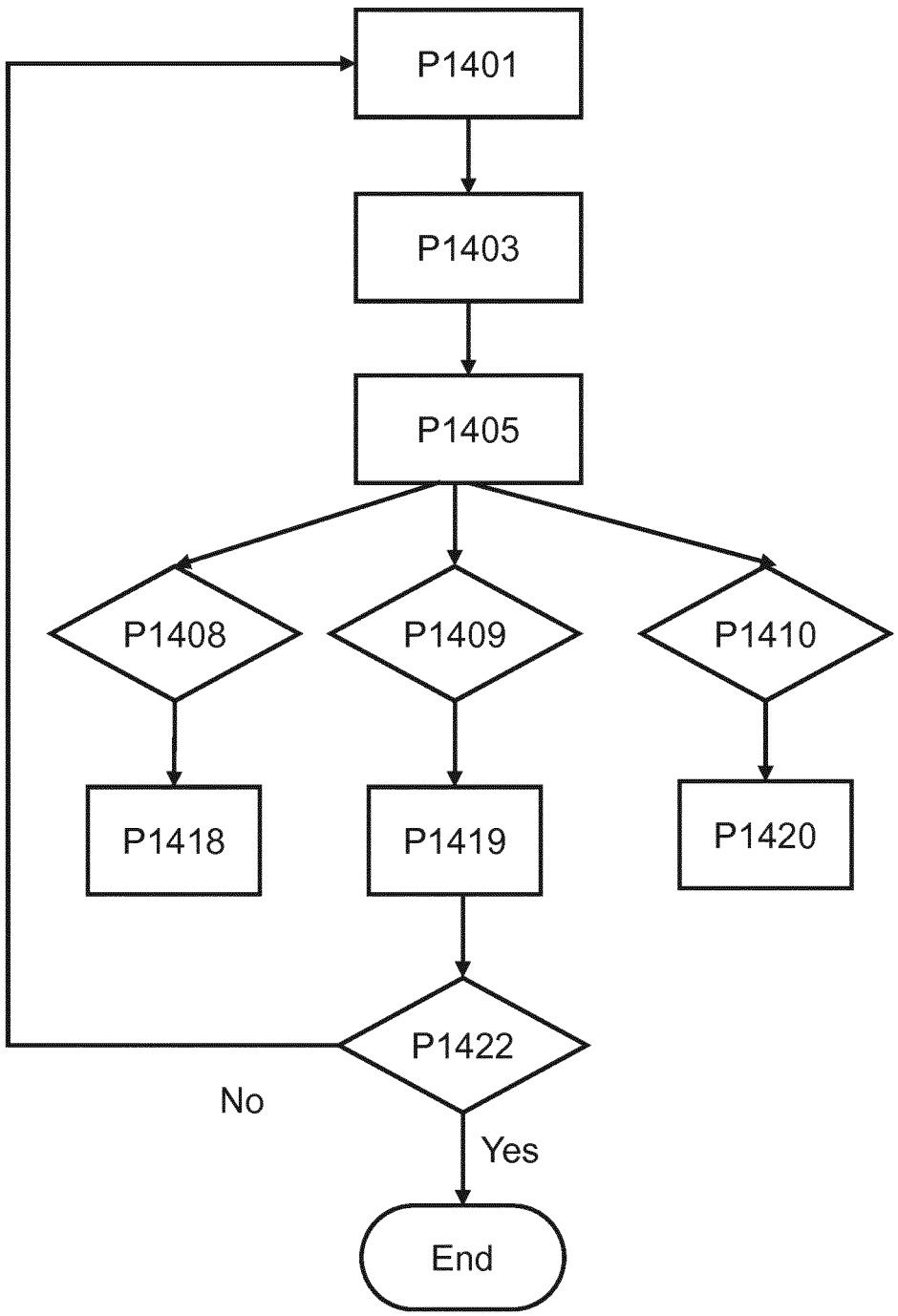
FIG. 14 is a method of determining optimized model parameter of a model, according to an embodiment.

Furthermore, in an embodiment, an optimization algorithm, discussed later in the disclosure, may be applied to select the values of the model parameter. The optimization algorithm is based on a parabolic function that establishes a trend between the measured values and the fitted values. The optimization algorithm has a faster convergence rate and produces accurate results, as well as reduce the computation time compared to convention optimization algorithms such as gradient decent or trust region global optimization algorithm. The optimization algorithm is discussed in detail with respect to FIG. 14. However, the present disclosure is not limited by the type of optimization algorithm and any effective optimizer can be used in this method. Furthermore, based on the optimized values of the model parameters, one or more stack characteristics (e.g., a layer thickness, SWA, etc.) can be deduced from the respective substrate model and the location on the substrate.

When the stop criterion is satisfied, in process P810, the values 810 of the model parameters are considered as final or optimized values 810 of the model parameter. The optimized values 810 of the model parameters may be further used (e.g., by a metrology tool) to accurately predict a stack configuration (e.g., a metrology target geometry). The improvement occurs due to the substrate model that has the optimized parameter values, where the parameter values are determined based on location specific stack information (e.g., stack characteristics) and measurements, thus capturing the process variation across the entire substrate (e.g., via the stack map).

The substrate model 803 with optimized model parameters establishes a high level of correlation (e.g., measured in terms of RMS) between the measurement and modeled data. The correlation may be explained in terms of a key performance parameter (KPI) such as stack sensitivity to a change in model parameter value. FIGS. 12A-12E illustrate example correlations between measured and modeled KPI of different layers at different locations on the substrate.

In FIGS. 12A-12E, the data points are associated with a position and/or a recipe combination of a substrate subjected to the patterning process. A high level of correlation is achieved through the tuning process of the substrate model 803, which may further help a user to investigate a stack configuration and identify the best stack model for a target design. In other words, based on a position on substrate being measured and the recipe corresponding to the position, an accurate stack configuration may be generated using the substrate model 803.

Figure 12A:
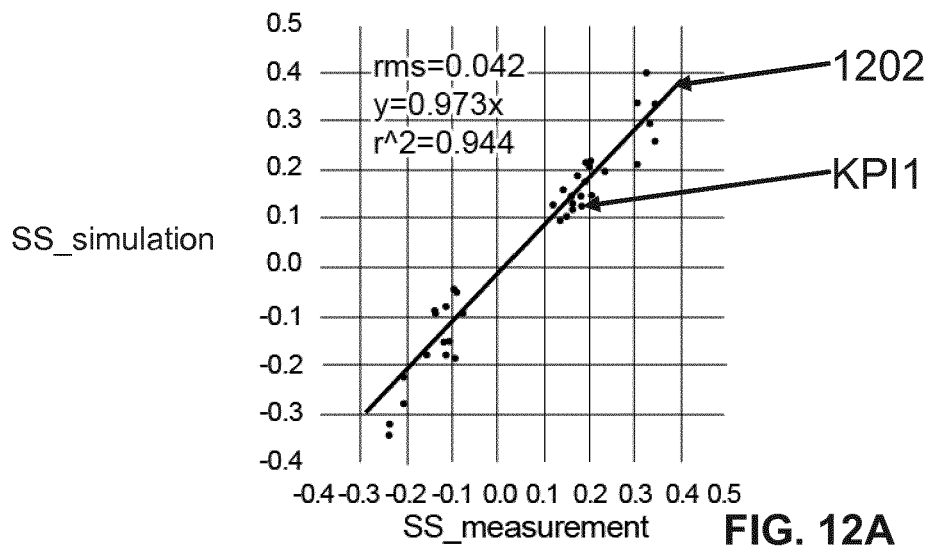
FIG. 12A illustrates an example correlation between measurement and simulated stack sensitivity at a first position on a substrate, according to an embodiment.
Figure 12B:
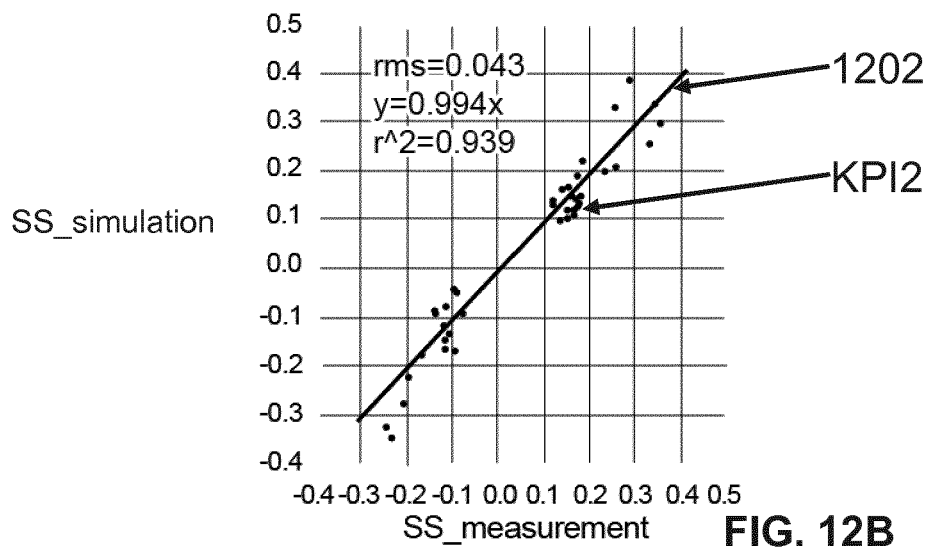
FIG. 12B illustrates an example correlation between measurement and simulated stack sensitivity at a second position on a substrate, according to an embodiment.
Figure 12C:
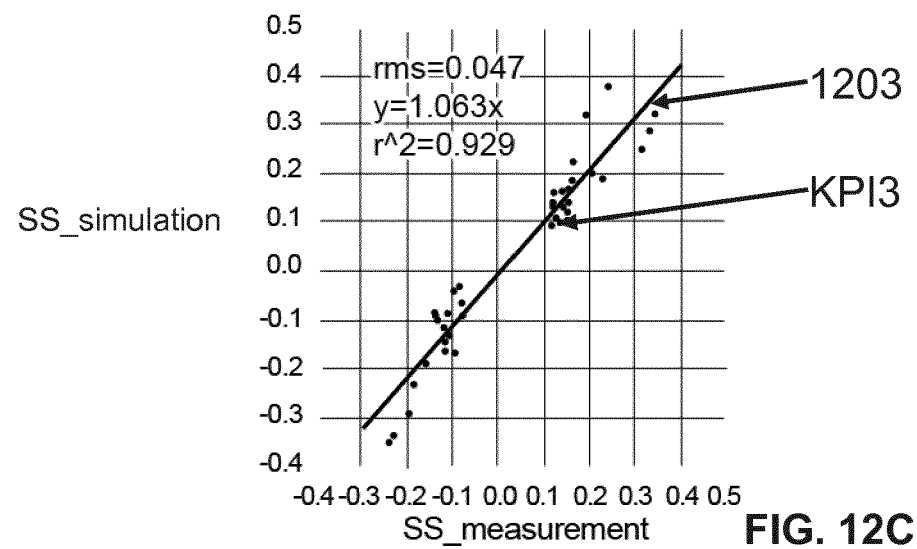
FIG. 12C illustrates an example correlation between measurement and simulated stack sensitivity at a third position on a substrate, according to an embodiment.
Figure 12D:
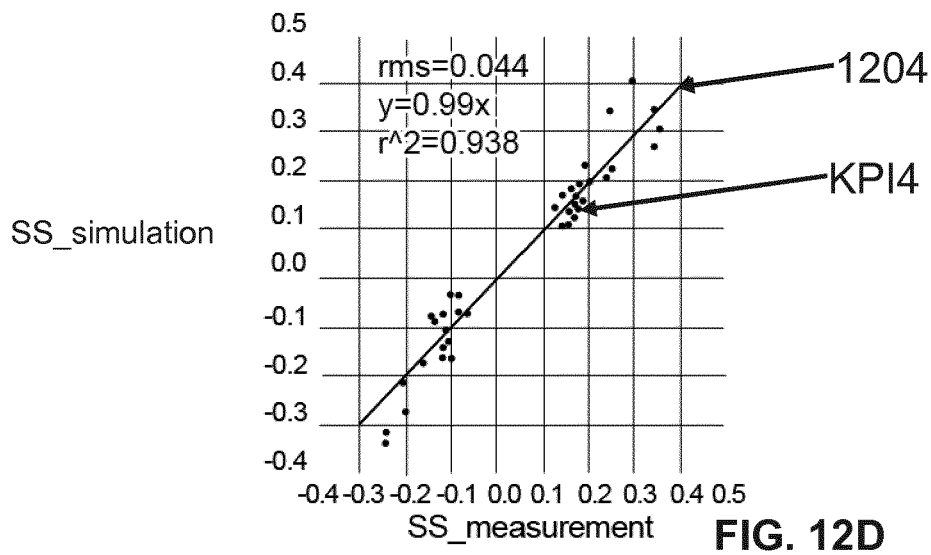
FIG. 12D illustrates an example correlation between measurement and simulated stack sensitivity at a fourth position on a substrate, according to an embodiment.
Figure 12E:
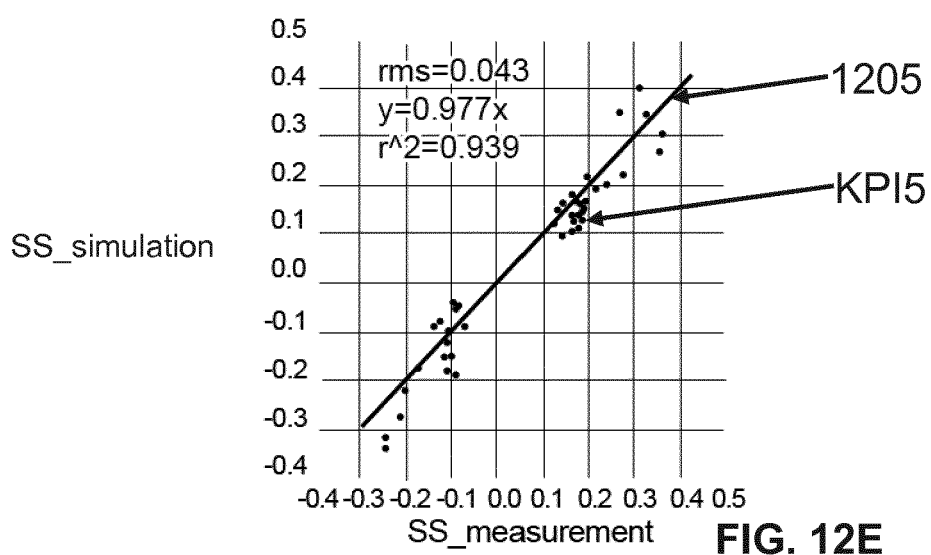
FIG. 12E illustrates an example correlation between measurement and simulated stack sensitivity at a fifth position on a substrate, according to an embodiment.
Figure 13A:
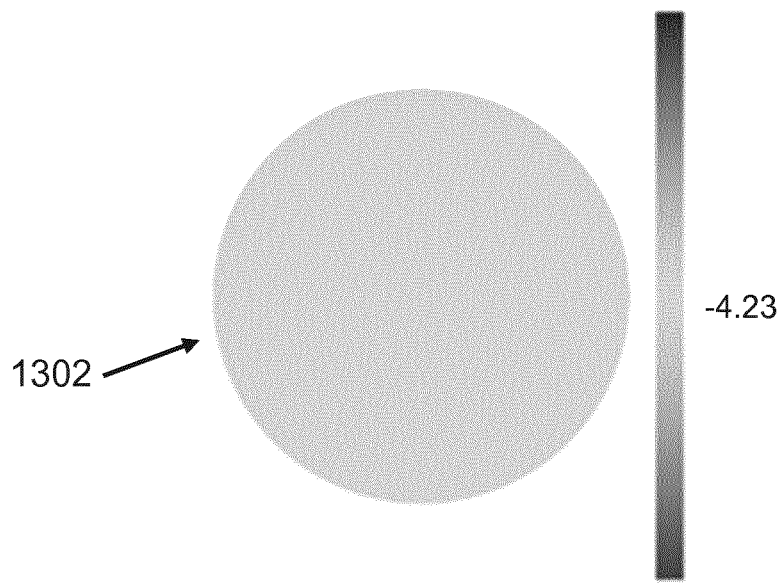
FIG. 13A illustrates an example thickness variation of an example layer of the substrate, according to an embodiment.
Figure 13B:
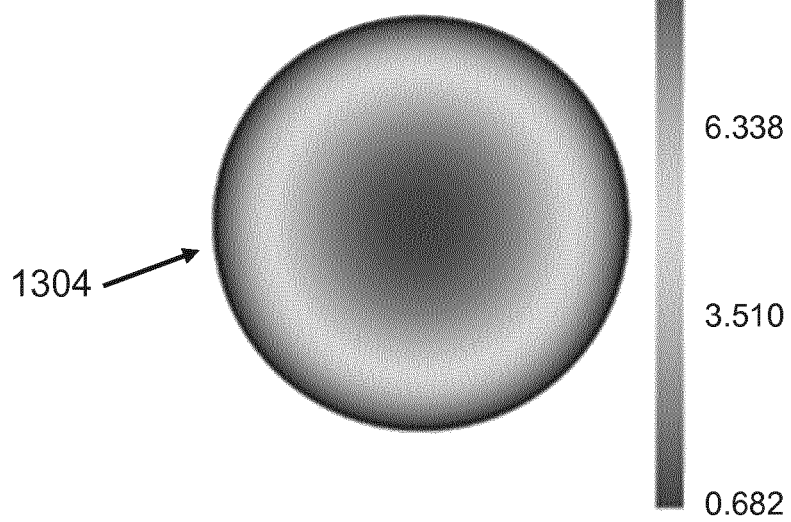
FIG. 13B illustrates an example thickness variation of another example layer of the substrate, according to an embodiment.
Figure 13C:
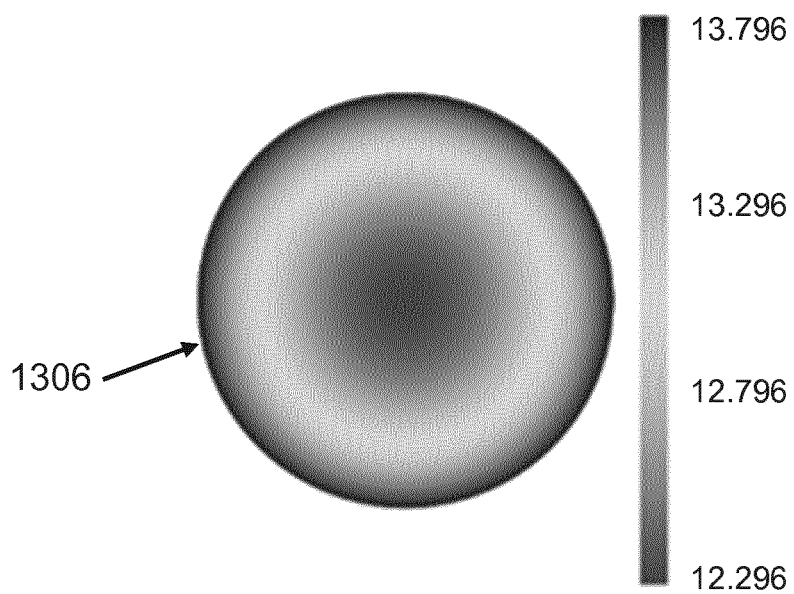
FIG. 13C illustrates an example thickness variation of yet another example layer of the substrate, according to an embodiment.
Figure 13D:
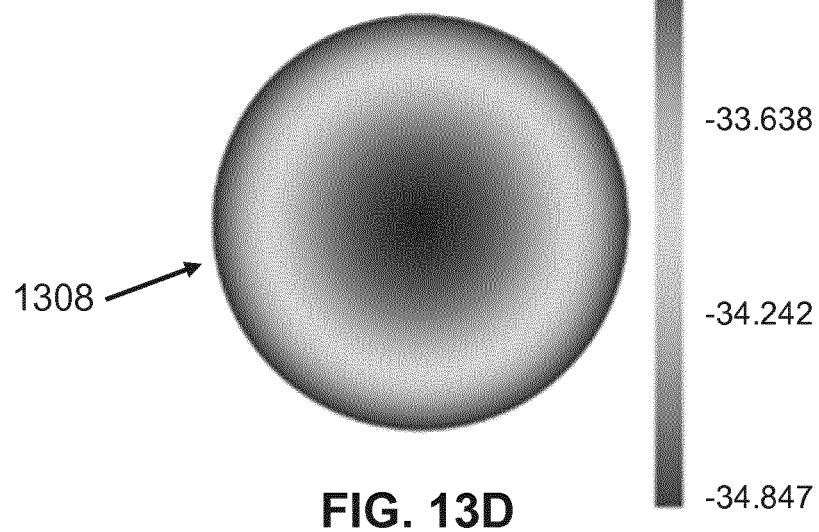
FIG. 13D illustrates an example thickness variation of yet another example layer of the substrate, according to an embodiment.

In an embodiment, with reference to FIGS. 12A-12E, an optimum (in an embodiment, best) tuning candidate (e.g., a layer of stack of the substrate) may be determined using the correlation of each substrate position and substrate maps of each layer. For example, FIG. 12A-12E show the correlations of each target recipe combination for each substrate position (e.g., P1, P2, P3, P4, and P5) in separate graphs. Each position demonstrates a good correlation between the simulated KPI and the measured KPI, thus indicating that the tuning candidate is valid for the tuning of the substrate model 803. For example, in FIG. 12A, the first key performance indicator KPI1 corresponding to the measurement data and the substrate model (e.g., of a first layer) based simulation results 1201 show a high correlation. Similarly, in FIG. 12B, the second key performance indicator KPI2 corresponding to the measurement data and the substrate model (e.g., of a second layer) based simulation results 1202 show a high correlation. In FIG. 12C, the third key performance indicator KPI3 corresponding to the measurement data and the substrate model (e.g., of a third layer) based simulation results 1203 show a high correlation. In FIG. 12D, the fourth key performance indicator KPI4 corresponding to the measurement data and the substrate model (e.g., of a fourth layer) based simulation results 1204 show a high correlation. In FIG. 12E, the fifth key performance indicator KPI5 corresponding to the measurement data and the substrate model (e.g., of a fifth layer) based simulation results 1205 show a high correlation. Hence, the high correlation enables tuning of the one of more of characteristics of the layers represented by respective substrate models to generate an optimum stack configuration.

The above method provides several advantages. For example, maps of a fingerprint or a characteristic (e.g., 1302, 1304, 1306, 1308) of different layers thickness-deviation from nominal may be generated. FIGS. 13A-13D show the maps of different layers indicating reasonable process variations across the different layers of the substrate. In an embodiment, the maps are generated using the substrate model of the respective layers, each model having respective optimized parameters, as discussed earlier with respect to the method in FIG. 8. For example, a resist layer 1302 (in FIG. 13A) shows a substantially constant variation in thickness-deviation across the substrate. An etch layer 1304 (in FIG. 13B) shows a thickness deviations around the edge of the substrate and at a center of the substrate. For example, the etch layer 1304 has a relatively greater thickness at the edges and a lesser thickness at the center of the substrate compared to a nominal thickness of the etch layer. Similarly, oxide layers 1306 and 1308 (e.g., SOH layer in FIG. 13C, and ASI layer in FIG. 13D) show reasonable thickness deviations across the substrate. Thus, the substrate model 803 with optimal or tuned model parameters may accurately predict a stack configuration and a target geometry via simulation.

Furthermore, maps of a fingerprint or a characteristic (e.g., in terms of thickness deviation, overlay, alignment, etc.) of a process of the patterning process or a layer formed by a process on the substrate may also be generated. For example, the substrate model 803 may also be used to generate a fingerprint (e.g., see FIGS. 11A-11D) caused by certain processes by simulation of a substrate model specific to a particular layer generated by the patterning process. For example, a fingerprint 1102 represents a thickness of a resist layer across the substrate, a fingerprint 1104 represents a thickness of an oxide layer, a fingerprint 1106 represent a thickness of the SiN layer, and a fingerprint 1108 represent a residual thickness, which is a remaining thickness that may be determined by removing thickness of different layers from the total thickness of the stack configuration. Thus, the substrate model can reconstruct fingerprints of each layer which may be further used for controlling one or more steps of the patterning process.

Furthermore, the method enables automatic stack tuning or stack configuration from any arbitrary conditions with capabilities to handle a large number of stack tuning parameters. Particularly, the location based substrate model 803 enables stack tuning of entire substrate that results in a high level of matching between the simulation results to the measurement results.

The stack configuration across the substrate automatically includes process variation factors that minimize error and offer accurate metrology control. In other words, there is no need to identify a position of interest during a stack reconstruction related to a process. A tool implementing the above method may substantially reduce time-intensive manual work (e.g., manual tuning performed by CS/Field/Customer engineers), which enables engineers to identify the accurate model for a true stack (i.e., an ideal stack) within a shorter time, hence helps improve the overall product performance. In most cases, the stack tuning based on the substrate model 803 is far superior than the results from tedious trial and error manual work.

The stack-tuning or determination of a stack configuration is a global optimization problem. Conventional solutions to such global optimization problems have several limitation including (i) local minimums issues, and (ii) computationally expensive global optimum search. The conventional tools implementing algorithms based on local optimization solvers can only find a close by local minimum. Most local optimization methods are gradient-based. These algorithms may result in a sub-optimal or untrue stack (i.e., because of use of a local optimum instead of the global optimum). Secondly, it is well known that nonlinear global optimization is challenging and expensive. The conventional global optimization tools are either based on brute force search or line scan. These tools have acceptable performance only when the problem is easy and the number of tuning parameters is small (e.g., less than 5). However, the conventional tool can be extremely time-consuming, unable to handle large number of tuning parameters, and unable to guarantee global optimum due to the nature of the algorithm. These problems with the conventional tool are further addressed by an optimization method discussed below.

FIG. 10 is a flowchart of an optimization method for determining values of model parameters of a model. For example, optimum parameter values that generate improved results when the model is executed. In an embodiment, the model (e.g., the substrate model 803) may be a statistical (or empirical or other mathematical model) representing a characteristic (e.g., thickness, side wall angle, focus, overlay) of the patterning process. The method determines values of model parameters based on an objective function and a fitting between the model and measurement data. In an embodiment, the values of the model parameters are determined based on updating a starting point (e.g., a center of a search region) and a search region (e.g., characterized by a radius) of the model parameters based on an objective function such that the objective function is reduced (in an embodiment, minimized). The objective function includes one or more terms including a fit level term (e.g., RMS) such as a measure of error between fitted and measured data, a first penalty term such as a Euclidean distance between the a current coordinate and a predicted next coordinate, and a second penalty term that forces the objective function to have positive values of parameters associated with the second order terms of the objective function.

In an embodiment, the optimization method may be applied to the substrate model 803 such as represented by equations 1-8, discussed above, to determine values of the model parameters such as k1, k2, k3, k7, Z1, Z2, Z4, etc. Given the number of parameters that must be optimized (in an embodiment optimized simultaneously), the method of the present disclosure can converge to the optimum values of the model parameters orders of magnitude faster than the conventional optimization algorithms such as gradient decent or trust-region. Thus, enabling real-time execution and improving the productivity of the patterning process. Furthermore, in an embodiment, the method may be used offline or real-time during the patterning process to determine optimum (e.g., a lowest value of a cost function) stack configuration. In an embodiment, metrology control and/or patterning process control may be determined based on the stack configuration.

The optimization method involves, in process P1401, obtaining (i) initial values includes a starting point and a search region of the model parameters, and (ii) measurement data corresponding to the characteristic (e.g., thickness of a layer, SWA of a layer, metrology recipe, etc.) of the patterning process. Furthermore, in an embodiment, the process P1401 may obtain a predicted characteristic (e.g., a stack characteristic as discussed earlier) using the initial values of the model parameter and the measurement data, and (iv) an objective function, discussed later in the disclosure with respect to process P1405. The predicted characteristic refers to a characteristic that the model is configured to predict. For example, the substrate model 803 based on the equations 1-8 are configured to predict a thickness difference (i.e., a characteristic) of a layer or multiple layers. In an embodiment, the predicted characteristic is iteratively computed in process P1403 of the present method.

In an embodiment, the starting point represents a value corresponding to a center of the search region. The search region is characterized (and modified) by a radius. The radius defines a limited search region within a potentially infinite space of model parameters. In an embodiment, a user may define constraints on the model parameters or a range of the model parameters to limit the search space. The center is a point within the search region of the model parameters and radius is a distance from the center, thus the radius creates an envelope around the center within which sampling may be performed. The center and radius are updated during one or more iterations of the optimization process based on predicted values of the model. For example, the center and/or radius is based on optimization of a key performance indicator (KPI) or a cost function determined based on the predicted values of the model. For example, the center may be moved to reach a global minima of the cost associated with the model predictions and/or the radius may be increased, decreased, or maintained at a current value based on a fitting level (or a quality of fit) between the measurement data and fitted data predicted by the model.

In an embodiment, the search region is a hyperball representing value space related to multiple parameters, where the center and radius of the search region are controlled by the model predictions and/or a fitting quality of the model with respect to the measurements. The center and/or radius may be chosen based on the fitting quality and certain criteria, where the criteria are hyper-parameters that a user can define. The center and/or radius may be selected based on different strategies, for example, based on a high fitting quality (e.g., a fitting quality ratio ≥1), a low fitting quality value (e.g., <1) or even slightly negative value etc.

The fitting quality (also referred as the fit or the fitting level) may be characterized by one or more statistical metric such as RMS, MSE, or other appropriate data fitting metrics. The fitted data is data predicted by the model (e.g., the substrate model 803) based on the values of the model parameter within the search region. The center and the radius may be modified based on a quality of fit between the fitted data and the measurement data, and penalty terms embedded in an objective function, as discussed in detail below. Such updating of the center and radius moves the search region from a random starting point in a potentially infinite space to a global minima or other optimum values of the model parameter for which the objective function related to the model is reduced (in an embodiment, minimized).

Furthermore, in the process P1401, the starting point and the search region is used to draw a first sample or a first set of sample points (e.g., 10 points, 20 points, 30 points, etc.) from the parameter space. For example, the first sample may be drawn by a sampling method (e.g., a Monte Carlo based method) based on a certain probability distribution (e.g., a uniform probability distribution. a normal probability distribution, or other probability distributions) within a search region (e.g., 1722 in FIG. 17A). In an embodiment, the search region may be modified in a subsequent iteration and a second sample may be drawn. The search region may be modified by modifying, for example, the center and the radius of the search region, further illustrated in FIGS. 17A-17C. Thus, the sampling is a self-adaptive process that updates the samples in an iterative manner. Such adaptive sampling reduces a computation time (or simulation time) of a patterning process (e.g., the D4C simulation), thus improving the productivity of the patterning process. In an embodiment, the patterning process (e.g., the D4C simulation) may be a real-time simulation product which runs very slowly in case of large number of simulations. Hence, the optimization method, according to the present disclosure, substantially reduces the amount of simulations and makes efficient and reasonable sampling possible for model fitting (e.g., fitting the substrate model 803 to the measurement data).

In an embodiment, a sampling scheme is characterized by a number of samples (or sampling density) drawn from the search region as a function of number of parameters and the radius (which can be controlled/updated). Accordingly, the number of samples may change with a change in the radius during the iterative process. In an embodiment, the number of samples may be controlled to improve the efficiency and accuracy of results of the method. In an embodiment, the number of samples (S) may be determined based on following equation 11:

$$S = SR * \text{number of parameters} * \left(A * e^{-\frac{radius^2}{2*B^2}} + C\right) \quad (11)$$

In the above equation, SR is a sample ratio, which is a hyperparameter, and A, B, and C are control parameters of the number of samples (S). radius is the search radius of the parameter space. In an embodiment, the number of samples can be updated by tuning the sample ratio (SR). In an embodiment, the sample ratio (SR) provides an external control to the user to modify the number of samples. Also, the number of samples may be controlled by changing the values of parameters A, B, and/or C. However, changing parameters A, B, and/or C may be based on understanding of the behavior of the exponential functions. In an embodiment, such control parameters A, B, and/or C may be changed less frequently compared to the sample ratio.

Figure 15:
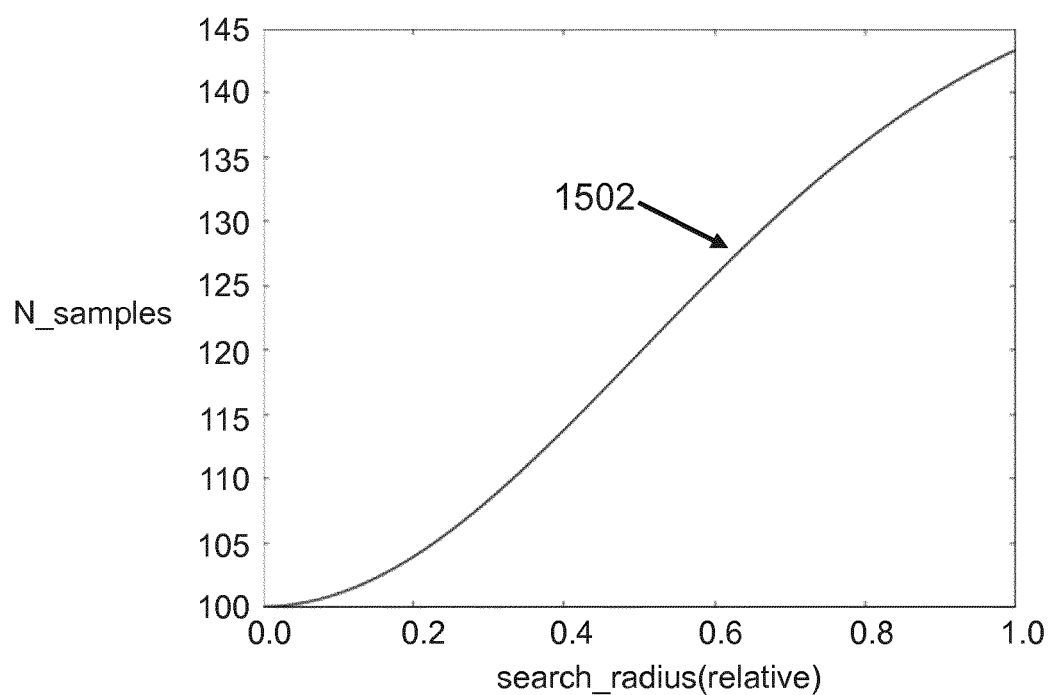
FIG. 15 illustrates an example relationship to determine a sample size, according to an embodiment.

In a non-limiting example of the sampling scheme as a function of the radius is illustrated in a graph 1502 of FIG. 15. The graph 1502 shows that the number of samples increase as the radius increases. Accordingly, during an iteration of the method, the number of samples may increase if the radius of the search region is increased, or the number of samples may decrease if the radius of the search region is decreased. The increasing or decreasing of the radius depends on the predicted values of the model and/or the quality of fit, as discussed later in the disclosure (e.g., in FIGS. 17A-17C).

Hence, using the equation 11 above, the sampling can be controlled based on the number of model parameters and the radius. Furthermore, the sampling may be controlled by varying the control parameters A, B, and/or C, or the hyper-parameter sample ratio. In subsequent iterations, the radius and/or the center may change based on the objective function. For example, the center may be moved to a point within the search region (or slightly outside the search region) where the objective function has a relatively low value, further illustrated with respect to FIGS. 17A-17C. Thus, the sample scheme is adapting with change in the radius and the center. In an embodiment, a current sample (e.g., a first sample) may be included in a sample pool and reused during iterations, for example, to determine the center and/or radius. This further improves the efficiency of the optimization method or the optimization algorithm.

Furthermore, the values of the model parameters (e.g., the first sample) may be used to evaluate the model (e.g., thickness of a layer, SWA, etc.). Further, the process P1403 involves determining a fitting between the model and the measurement data. For example, the model fitting may be determined based on the first sample and a cost model. In an embodiment, a cost model may be a defined as, for example, a second order polynomial model. The second order polynomial model may be a parabolic model that captures an overall trend of the data. In addition, the second order polynomial model is noise-resistive and is not affected by local minimums of the search space or the entire space in general. Thus, compared to the traditional gradient based methods, the method is noise-resistive and not affected by local minimums. In other words, if the solution space includes many small local minimums/fluctuations, the parabolic fitting can ignore such local minimums/fluctuations.

Figure 16A:
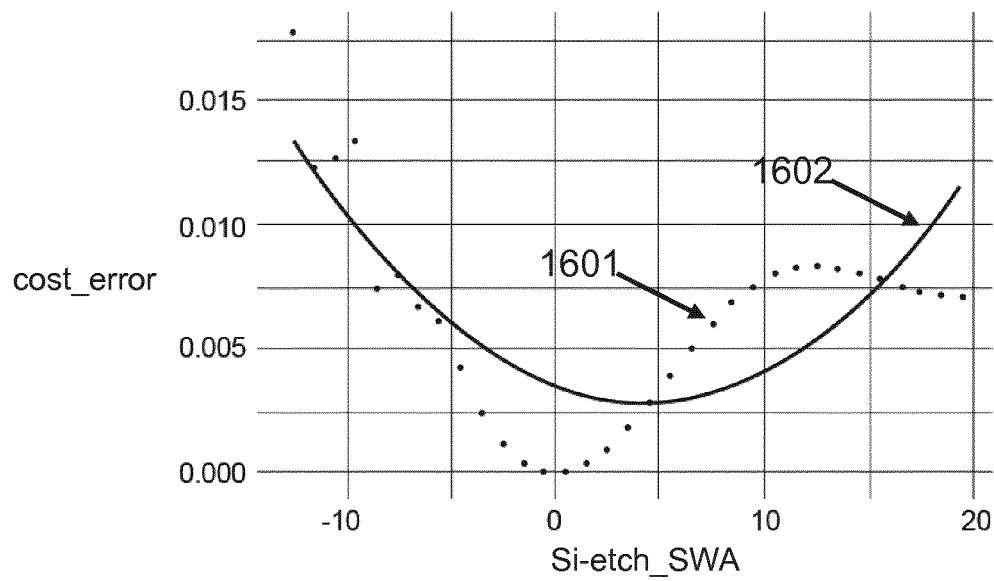
FIG. 16A illustrates an example model fitting with measurement data with 30 data points for an example layer, according to an embodiment.

An example fitting of measurement data and model is illustrated in FIGS. 16A-16D. In the non-limiting example, FIGS. 16A-16D illustrates a fitting of the model with measurements of SWA of an etch layer collected for measurement targets 1, 2, and 3 located at different locations on a substrate. In FIG. 16A, the fitting is based on a 30 sample points. A cost or error (e.g., a distance or RMS value) between the fitted model (i.e., a curve 1602) and the measurement data 1601 varies as the SWA increases or decreases and the cost appears to be lowest for side wall angle around or at zero. The cost or error increases as the SWA becomes greater than zero or lower than zero. It can be seen that the parabolic model fitting (i.e., the curve 1602) captures the overall trend of the measurement data 1601. As the SWA increases from a negative value to zero, the cost or error decreases and forms a valley around the zero value (e.g., between −1 and 5 units). Further, as the SWA increases beyond 5, the cost or error starts increasing.

Figure 16B:
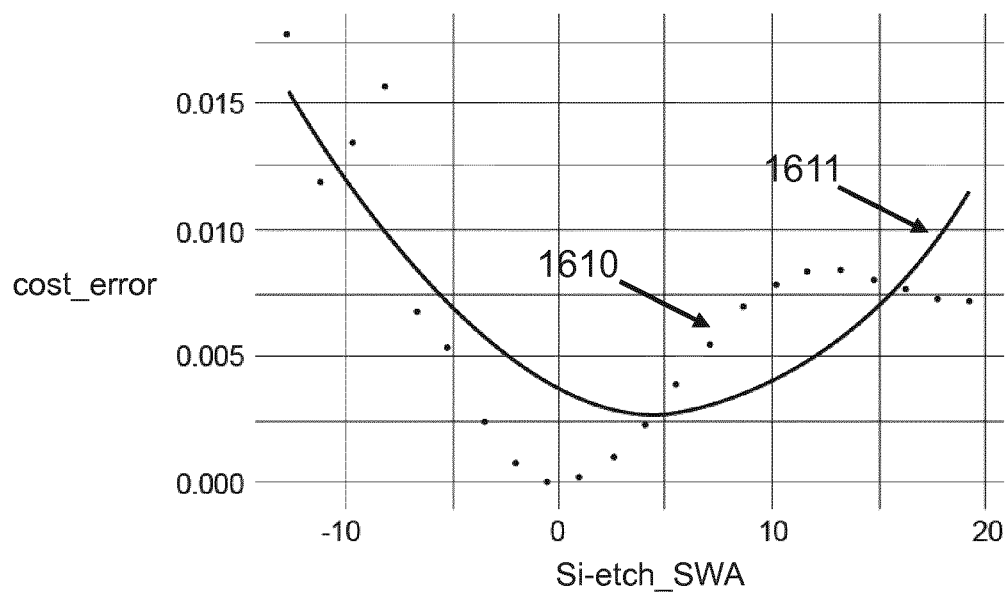
FIG. 16B illustrates an example model fitting with the measurement data with 20 data points for the example layer of FIG. 16A, according to an embodiment.
Figure 16C:
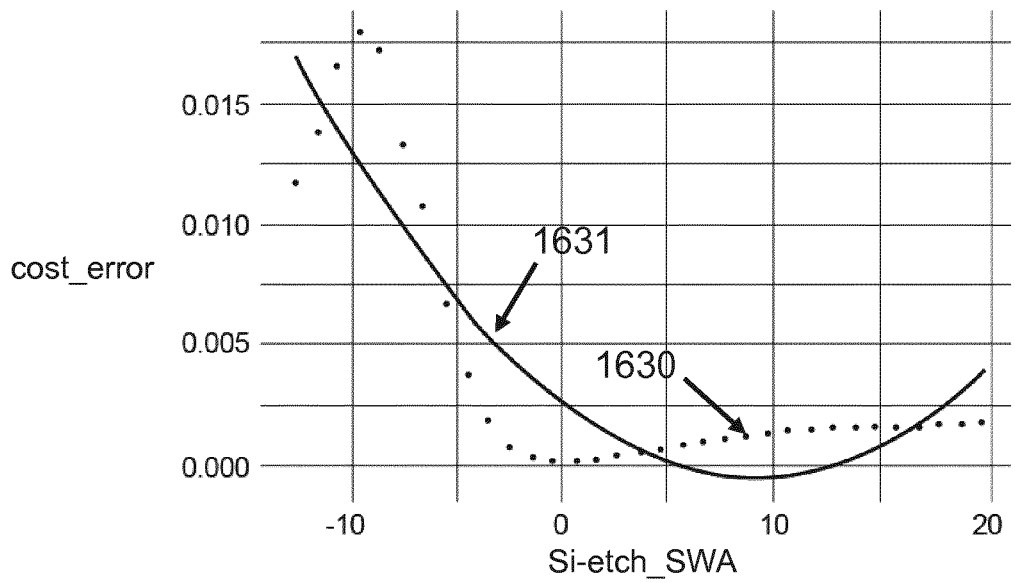
FIG. 16C illustrates another example model fitting with the measurement data with 30 data points for another example layer, according to an embodiment.
Figure 16D:
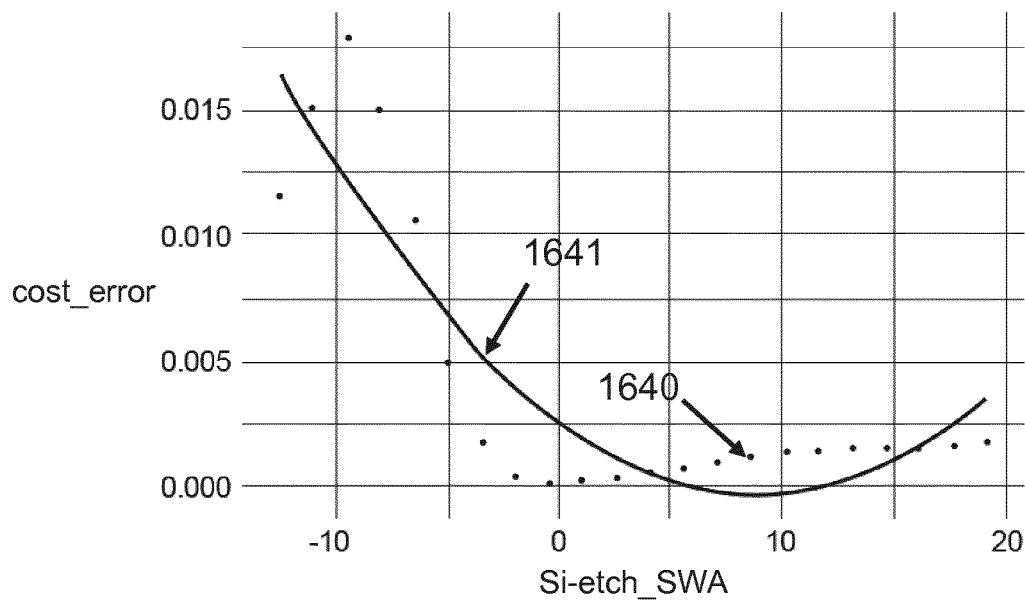
FIG. 16D illustrates another example model fitting with measurement data with 20 data points for the example layer of FIG. 16C, according to an embodiment.

In an embodiment, FIG. 16B illustrates a similar fitting between curve 1611 and the measurement data 1610. The curve 1611 also captures the trend with fewer data points (e.g., 20 data points) than used in FIG. 16A. Similarly, FIG. 16C illustrates a fitting of the model (i.e., a curve 1631) with measurements data 1630 of SWA of an etch layer collected for measurement targets 4, 5, and 6 located at different locations on the substrate. It can be seen that the parabolic model fitting (i.e., the curve 1631) captures the overall trend of the data 1630. A valley or low cost area is formed around the SWA value of 10. In an embodiment, FIG. 16D illustrates a similar fitting between a curve 1641 and the measurement data 1640. The curve 1641 also captures the trend with fewer data points (e.g., 20 data points) than used in FIG. 16D.

The parabolic model fitting captures the overall trend of the data. The parabolic model helps to determine a most likely location of a cost valley (e.g., where an error between the fit and measured data is reduced or minimum). Being able to locate the cost valley enables model fitting using fewer sample. For example, even if sampling around only part of the valley, the fitting can still direct towards the overall valley orientation. Such a direction is an approximate direction but as the model parameter value progressively leads to a global minimum of the objective function, the solution space of the model parameter becomes more prominent. Thus, some of the benefits of using a parabolic model, according to an embodiment, includes faster convergence compared to gradient descent method, where finding the next point and/or search region is based on a certain learning rate (i.e., a small increment). On the other hand, the parabolic model enables a jump with a bigger step (compared to the learning rate) from one search area to another area. Furthermore, the parabolic model provides a holistic view (instead of local information as in a gradient descent method) and can be noise resistive, as mentioned earlier.

In an embodiment, the model can be represented by equation 12 as follows:

$$Y = (a_1 X_1 + b_1)^2 + (a_2 X_2 + b_2)^2 + (a_3 X_3 + b_3)^2 + \ldots + (a_n X_n + b_n)^2 \quad (12)$$

In the above equation 12, $X_1, X_2, X_3, \ldots, X_n$ represent a coordinate vector in n-parameter space, Y is a characteristic to be predicted, and $a_1$ through $a_n$ and $b_1$ through $b_n$ are the model parameters to be determined. In the above model, the prediction of characteristic Y is based on a global minimum value i.e., Y=0, which indicates a coordinate $X_n$ is a function of model parameter, e.g., $$X_n = -\frac{a_n}{b_n}.$$

In an embodiment, the working principle of fitting the above model (Y) can be explained as follows. Assume (i) there exists a function that describes a contribution to an error in model prediction as $cost_i(Y) = f(X_i)$, and (ii) all model parameters are independent contributing factors (e.g., $X_1, X_2, X_3, \ldots, X_n$) to a disturbance to a nominal stack (e.g., a true stack provided by a designer) and that these factors induce error in a KPI (e.g., stack sensitivity), then an overall cost of each point in the multi-dimensional parameter hyperspace (e.g., having more than 4 dimensions or model parameters) is a linear combination of contribution of each individual model parameter that can be represented as equation 13 below:

$$Y = a_1 f(X_1) + a_2 f(X_2) + a_3 f(X_3) + \ldots + a_n f(X_n) = \sum_{i=1}^{n} a_i f(X_i) \quad (13)$$

In an embodiment, $f(X_i) = (a_i X_i + b_i)^2$ is a parabolic relationship used to approximate the error behavior of a disturbance or a perturbation. For example, FIGS. 16A-16D illustrates an error behavior with respect to a disturbance (e.g., in the SWA). FIG. 16A indicates that a large perturbation causes a large error to be added to the cost. In an embodiment, the error is treated symmetrically when the perturbation goes to either positive or negative direction (e.g., positive or negative values of SWA). Thus, the model is composed of a network of 2nd order polynomial functions (e.g., a parabolic function) $Y = \sum_{i=1}^{n} Y_i = \sum_{i=1}^{n} (a_i X_i + b_i)^2$, where each of terms represents a cost associated with a characteristic of the substrate (e.g., SWA, thickness) in terms of the multi-dimensional model parameter space. In an embodiment, the cost $Y_i$ symmetrically distributes around $X_i$ position, which is computed as $$-\frac{b_i}{a_i},$$

where Y or $Y_i$ has the lowest value (e.g., Y=0).

In an embodiment, the model (Y) is based on two assumptions: (i) the error each perturbation or disturbance contributes has a parabolic relation with its perturbation amplitude, and (ii) contributions of model parameters are independent of each other. In several cases the two assumptions may be violated, however, the model still enables good predictions because the model captures the overall trend of a hyperspace of the model parameters without overfitting or overcompensating for complicated curvature of the hyperspace. Of course the parabolic model is not the best approximation function, however the parabolic model is a simple to implement and enables improved computation speed and resulting values of the parameters provide high correlation between the measurement data and the model.

In an embodiment, the above model may be used in conjunction with an objective function (or a cost function) in a trust region-like algorithm. The objective function used within the trust region algorithm includes penalty term(s) according to the present model. In an embodiment, the objective function comprises more than one term including a fitting term (e.g., RMS), a first penalty term (e.g., an Euclidean distance), and/or a second penalty term (e.g., penalty positive). The objective function according used for optimization method may be represented by following equation 14:

$$\text{Objective=fit level}+\lambda1*\text{penalty\_distance}+\lambda2*\text{penalty\_positive} \quad (14)$$

In the above equation 14, the objective is a value to be reduced (in an embodiment, minimized), a fit level is a term (e.g., RMS, MSE, etc.) that determines a level of fit between the model and the measured data, $\lambda1$ and $\lambda2$ are parameters that can be optimized to improve the penalty performance, penalty distance is a Euclidean distance between the last coordinate (the starting point for a current iteration) and the predicted next coordinate (e.g., center calculated in a current iteration), and the penalty_positive term is used to force the coefficients of 2nd order terms to be positive. In an embodiment, the penalty_distance is minimized in order to limit the step size between the starting point and the next point. In several cases once the solution space has flat or complicated topography, the predicted optimum tends to make large jumps or go to infinity. The penalty_distance term thus guides the model to choose a nearest feasible point (e.g., within the search region) with respect to the starting point instead of a relatively faraway low-cost point (e.g., outside the search region).

As mentioned earlier, the penalty_positive term is used to force the coefficients of 2nd order terms to be positive. For example, the coefficients of 2nd order terms may be terms of the model (Y) (e.g., equation 12) rewritten in an expanded form (equation 15) as follows. Then, the coefficients of 2nd order terms are $A_1, A_2, A_3, \ldots, A_n$ should be positive so that a valley may be formed (e.g., see curves 1601, 1611, 1631, and 1641), otherwise the curve will be inverted and no valley may be formed.

$$Y=A_1X_1^2+B_1X_1+C_1+A_2X_2^2+B_2X_2+C_2+\ldots+A_nX_n^2+B_nX_n+C_n \quad (15)$$

Furthermore, the above equation 15 may be represented in a matrix form (eq. 16) to build a linear regression model as:

$$Y=\beta X \quad (16)$$

In the above equation 16, Y is the cost vector, X is generally referred as a design matrix (e.g., representing substrate characteristics such as thickness and SWA) and $\beta$ is the coefficient vector. An example matrix form is shown below:

$$\begin{bmatrix} Y_0 \\ Y_1 \\ Y_2 \\ \vdots \\ Y_m \end{bmatrix} = \begin{bmatrix} X_{1,0}^2 & X_{1,0} & X_{2,0}^2 & X_{2,0} & \ldots & X_{n,0}^2 & X_{n,0} & 1 \\ X_{1,1}^2 & X_{1,1} & X_{2,1}^2 & X_{2,1} & \ldots & X_{n,1}^2 & X_{n,1} & 1 \\ X_{1,2}^2 & X_{1,2} & X_{2,2}^2 & X_{2,2} & \ldots & X_{n,2}^2 & X_{n,2} & 1 \\ \vdots & \vdots & \vdots & \vdots & \ddots & \vdots & \vdots & \vdots \\ X_{1,m}^2 & X_{1,m} & X_{2,m}^2 & X_{2,m} & \ldots & X_{n,m}^2 & X_{n,m} & 1 \end{bmatrix} \begin{bmatrix} A_1 \\ B_1 \\ A_2 \\ B_2 \\ \vdots \\ A_n \\ B_n \\ C \end{bmatrix}$$

In the above matrix, m is the number of sample points, n is the number of parameters. A, B correspond to the coefficient of $2^{nd}$ order and $1^{st}$ order terms, respectively, and C is the intercept. When solving this linear matrix equation, it should be ensured that the fitting coefficient $A_1$ through $A_n$ are all positive numbers in order for the model to have a global minimum. Negative values of $A_1$ through $A_n$ may invert the parabolic curve (e.g., the curves 1601, 1611), and no valley may be observed. Such constraints may be implemented as inequality constraints to form a constrained optimization problem.

In an embodiment, the penalty_positive term of equation 14 is defined as an exponential decay function as follows:

$$\text{penalty\_positive}=\Sigma_i^n \alpha_1 * e^{-\alpha_2 A_i} \quad (17)$$

In the above equation 17, $\alpha_1$ and $\alpha_2$ are relatively large numbers (e.g., of the order of 1E10) that can be tuned as an inner variable (e.g., within a program code) of the optimization algorithm. If any coefficient $A_1$ through $A_n$ goes to the negative value, the penalty_positive will smoothly shoot to a very large number, effectively forming a barrier to prevent $A_n$ from going to the negative value. In other words, a high value of the penalty_positive will result in a higher value of the objective function, thus indicating a non-optimal solution.

In process P1405, the method involves determining a fit quality based on the objective function. In an embodiment, the fit quality may be defined as a ratio of a modeled cost and a true cost. In an embodiment, the fit quality is modified based on the true cost and the modeled cost to represent a percentage value. The true cost refers to cost determined based on a difference between a reference stack (or true stack/ideal stack) provided by a designer and the measurement data. The modeled cost refers to a value of the objective function.

In an embodiment, suppose a model is f(x), the fitting quality=[f(prediction point)−f(last point)]/[actual_value (prediction point)−actual_value(last point)].

The fitting quality describes how much the model follows a real shape of the solution space. Ideally, the model should follow the shape closely, so that the ratio is approximately 1 or even larger. The smaller the ratio the worse the fitting is. If the ratio is negative, it means the model trend is opposite to the true shape then the fitting is very bad.

Based on the fit quality, further processes involve updating the starting point and/or the search region. In an embodiment, the radius and/or the center may be updated. For example, if the fit quality is good, the center may be updated and the radius may be enlarged. If the fit quality is acceptable, then only center may be updated and the radius may be maintained at a current value. If the fit quality is bad, then the radius may be reduced and the center may be maintained at the current value. In embodiment, a goodness or acceptability of the fit quality may be based on breaching of certain threshold values. For example, if the fit quality is greater than, for example 70%, then the fit quality is good. If the fit quality is between 40%-70%, then the fit quality is acceptable. If the fit quality is less than 40%, then the fit quality is bad.

In process P1408, a determination may be made whether the fit quality breaches a first threshold. In an embodiment, the first threshold may be 70%. Thus, if the fit quality is greater than or equal to 70%, then the fit quality is good and a process P1418 is performed. A good fit quality indicates that the current search region provides more than sufficient sample points around the current center. As such, the current center may be moved, as well as the radius may be enlarged.

The process P1418 involves updating the starting point and the search region by selecting a new starting point (i.e., a center) and increasing the search region. In an embodiment, the new center may be a point having a relatively low value of the objective function within the search region. In an embodiment, the new center may be a value just outside the boundary of the search region, in a direction where the value of the objective function gradually decreases. Furthermore, in an embodiment, the search region may be enlarged by an enlargement factor. In an embodiment, the enlargement factor may be expressed in terms of a percentage. For example, the search region may be enlarged by increasing the radius, for example, increasing by 25% of the current radius value. The present disclosure is not limited to a particular enlargement factor and any appropriate enlargement value or an enlargement function may be defined to gradually increase the search region in a current or subsequent iterations.

In process P1409, a determination may be made whether the fit quality breaches a second threshold. In an embodiment, the second threshold may be a range between 40%-70%. Thus, if the fit quality is greater than or equal to 40% and less than 70%, then the fit quality is acceptable and a process P1419 is performed. An acceptable fit quality indicates that the current search region provides sufficient sample points around the current center. As such, the current center may be moved without changing the radius.

The process P1419 involves updating the starting point by selecting a new starting point (i.e., a center). In an embodiment, the search region may not be updated. For example, a current value of the radius may be used for subsequent iteration. In an embodiment, the new center may be a point having a relatively low value of the objective function within the search region. In an embodiment, the new center may be a value just outside the boundary of the search region, in a direction where the value of the objective function gradually decreases.

In process P1410, a determination may be made whether the fit quality breaches a third threshold. In an embodiment, the first threshold may be 40%. Thus, if the fit quality is less than 40%, then the fit quality is bad and a process P1420 is performed. A bad fit quality indicates that the current search region does not sufficient sample points and/or the current center is far from an optimum value of the objective function. As such, the search region may be reduced and the current center may be maintained.

The process P1420 involves updating the starting point and the search region by decreasing the size of the search region. In an embodiment, the search region may be decreased by a reduction factor. In an embodiment, the reduction factor may be in percentage. For example, the search region may be decreased by decreasing the radius, for example, by 25% of the current radius value. The present disclosure is not limited to a particular reduction factor and any appropriate reduction value or a reduction function may be defined to gradually decrease the search region in a current or subsequent iterations.

In process P1422, a determination is made whether a stopping criterion is met. The stopping criterion may be a threshold value of number of iterations, or a cost/objective function related value. When the stopping criterion is not met, the flow leads to the process P1401 to start a next iteration. In the next iteration, the center and radius values determined in the process P1418, P1419, or P1420 are used. After several iteration, the solution may converge, i.e., no further improvement in the cost or objective function may be observed. When the stopping criterion is met, the model parameter values obtained are termed as optimized model parameter values, which can be further used to determine an optimum stack configuration and/or a stack characteristics.

Figure 17A:
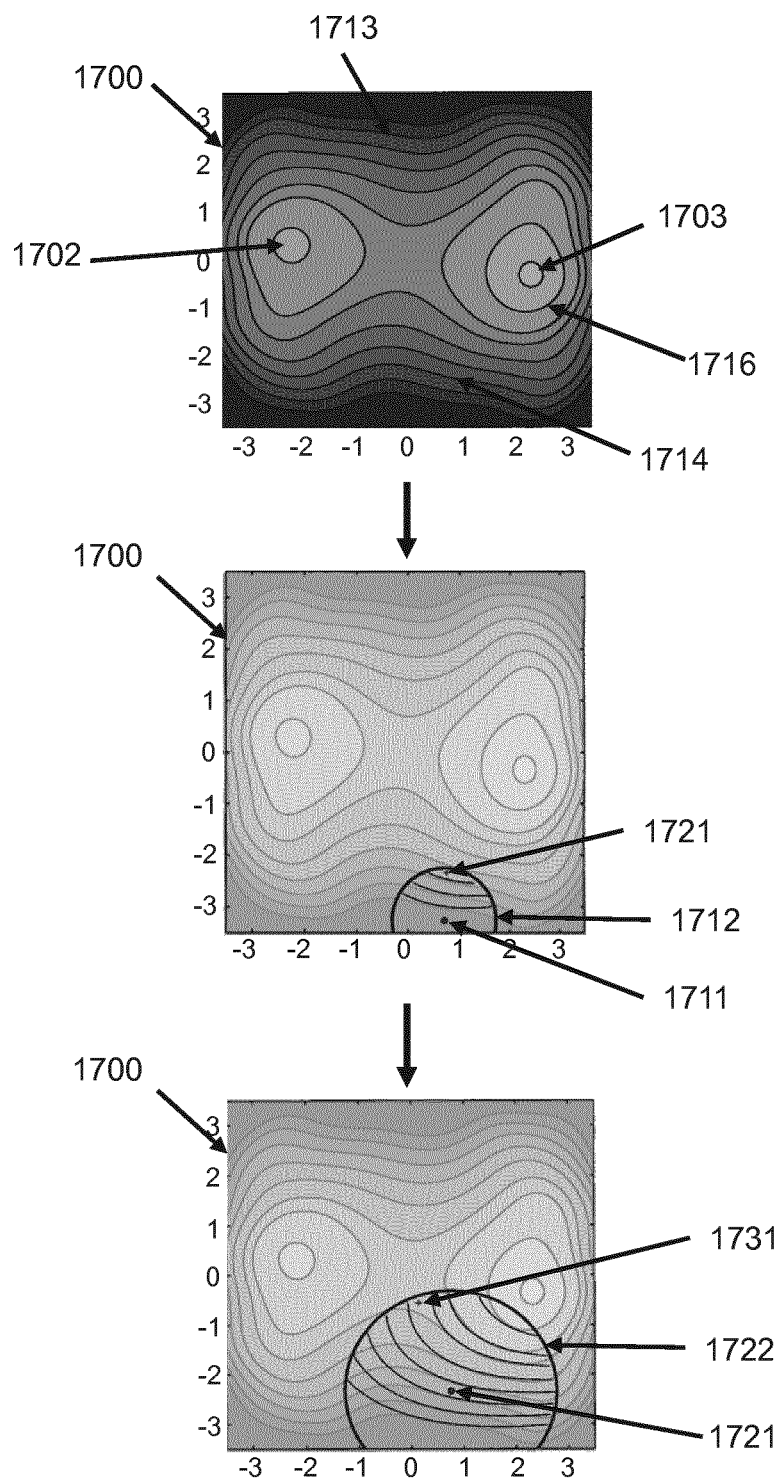
FIG. 17A illustrates an example operation of changing a search region and center for a good fit condition based on the method of FIG. 14, according to an embodiment.
Figure 17B:
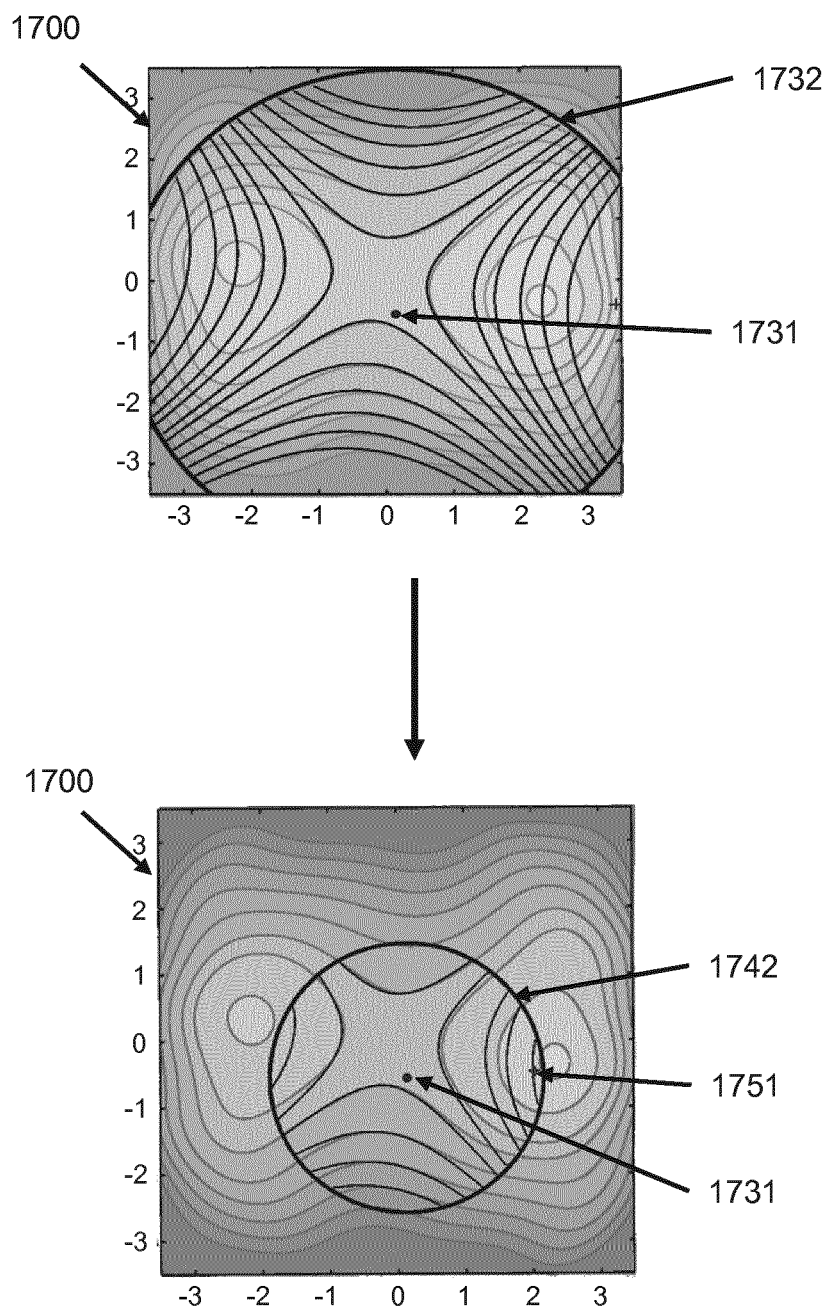
FIG. 17B illustrates an example operation of changing a search region and center for a good fit based on the method of FIG. 14, according to an embodiment.
Figure 17C:
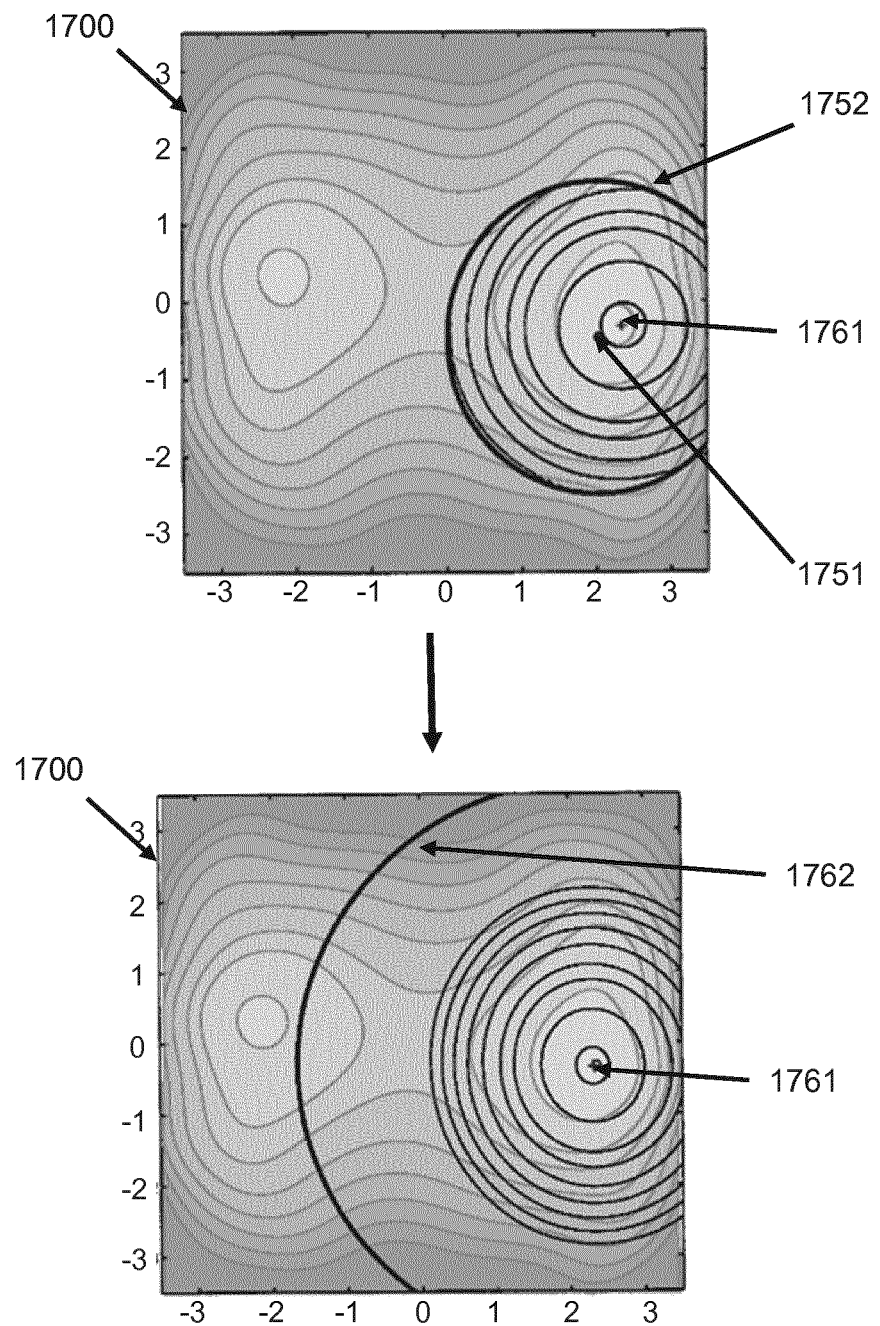
FIG. 17C illustrates an example convergence of the method of FIG. 14, according to an embodiment.

FIGS. 17A-17C illustrate examples of how the radius and center may be updated. For illustration purposes, a search region 1712 having a center 1711 is plotted on an objective function map 1700. The objective function map 1700 graphically depicts regions or a range of values of the objective function, for example, a light grey region indicates lower values than a dark grey region. In an embodiment, contour lines may also be included to indicate the similar values of the objective function. For example, innermost contour lines 1702 and 1703 indicate lower values (in an embodiment, lowest) compared to outer contour lines 1713, 1714, and 1716. In an embodiment, the values of the objective function gradually increase from inside (e.g., 1715) to outside (e.g., towards 1713), each contour line indicating a particular value of the objective function.

In FIG. 17A, once a plot of the objective function is generated (e.g., via simulation), a first center 1711 (or a starting point) and a first search region 1712 is plotted on the objective map 1700. Within the first region 1712, a cost may be estimated using the second order parabolic equation as discussed above. Based on the cost, a second point 1721 may be selected that has a lowest cost value in the search region 1712. It may be evaluated that the model parameters corresponding to the second point 1721 result in a good fit (e.g., as discussed in the process P1408 earlier). Then, the starting point 1711 may be updated as the second point 1721, as well as the first search region 1712 may be expanded to a second search region 1722, as mentioned in process P1418 earlier. Furthermore, the cost function may be evaluated within the second search region 1722 to determine a third center 1731 having a lowest cost value within the second search region 1722. In addition, a third search region greater than the second search region 1722 may be determined.

In FIG. 17B, illustrates an example, where a bad fit may be obtained and the search radius may be reduced, as mentioned in processes P1410 and 1720 earlier. For example, the third center 1731 and a third search region 1732 provide parameter values that result in a bad fit. In this case, the third center 1731 may be maintained (i.e., a fourth center is same as the third center 1731) and a fourth search region 1742, which is smaller than the third region 1732 may be determined. Further, the cost function may be evaluated within the fourth search region 1742 to determine a fifth center 1751 having a lowest cost value within the fourth search region 1742. It can be seen that the fourth search region 1742 provides a next center 1751 close to the low value 1703 (in an embodiment, lowest or minimum value) of the objective function. The fourth region 1742 and the center 1751 may result in an acceptable fit.

FIG. 17C illustrates an example where the solution converges. For example, according to the process P1009 and P1019, the fifth center 1751 may be maintained and a fifth search region 1752 may be defined. The model parameters within the search region 1752 may result in a good fit. Then, the process of P1008 and P1018 (as illustrated in FIG. 17A) may be repeated, which may result in a sixth center 1761 and a sixth search region 1762 that provides a global optimum values of the model parameter. Any further iteration may not reduce the value of the objective function, at which point the solution is said to be converged and the corresponding values of the model parameters are considered as the optimum values.

In an embodiment, the optimization method may be supplemented with additional complementary solutions to improve the accuracy and efficiency. For example, a sample pool may be created to reuse certain samples (e.g., a second sample) to improve efficiency. A brute force search (e.g., as a follow up after the convergence according to the present method) to determine an improved parameter values may alternatively be used. In such brute force based implementation, the results of the present optimization method may serve as an initial starting point (instead of a random starting point) that eventually leads to faster execution of the traditional brute force based method. The brute force method may also be based on a Monte Carlo sampling method.

Figure 18:
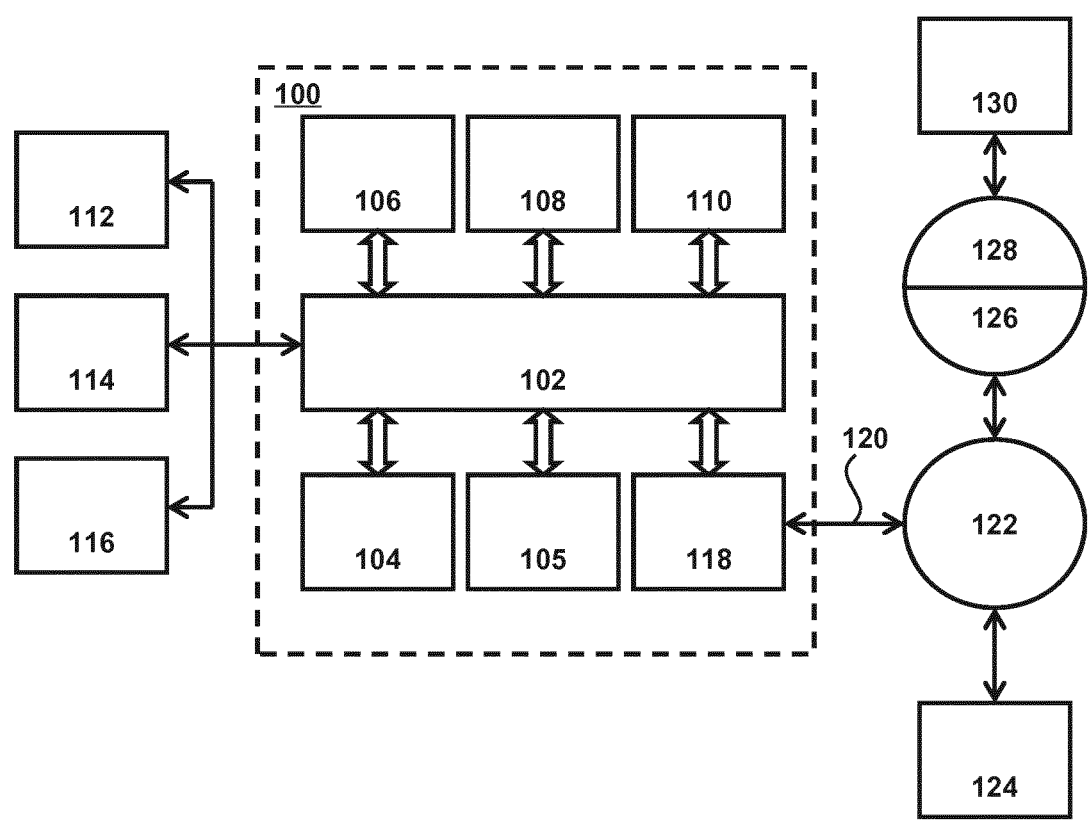
FIG. 18 is a block diagram of an example computer system, according to an embodiment.

FIG. 18 is a block diagram that illustrates a computer system 100 which can assist in implementing the methods, flows or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hardwired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 19:
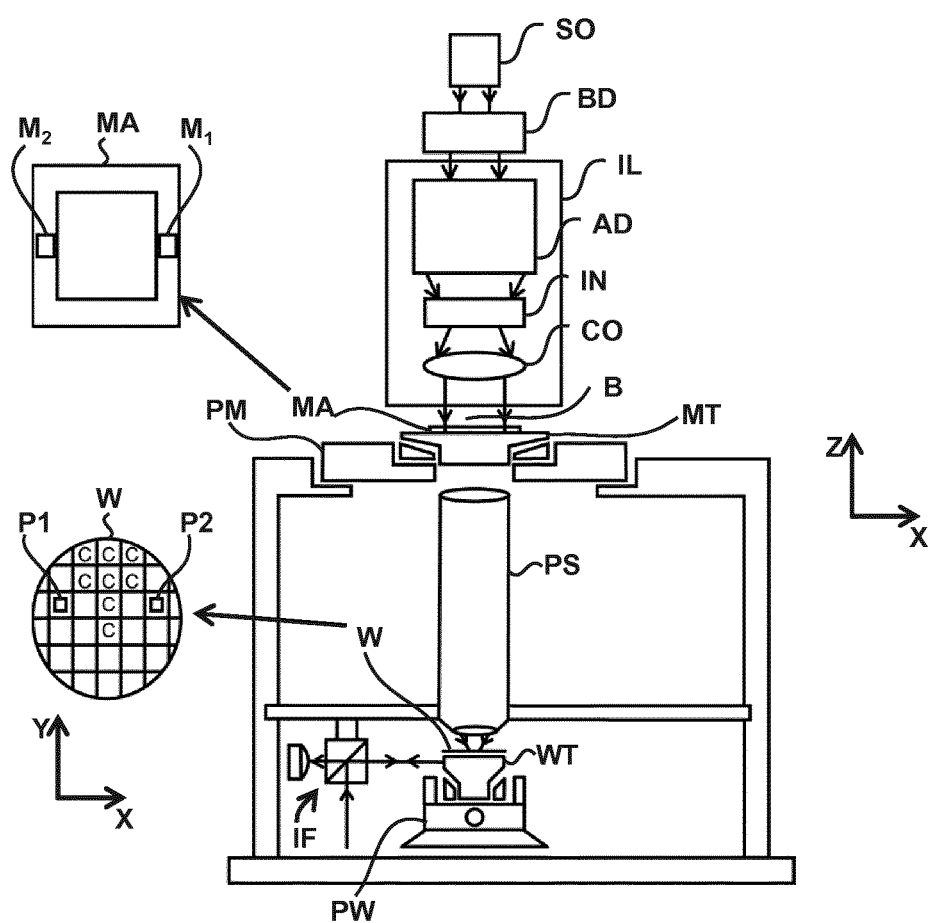
FIG. 19 is a schematic diagram of a lithographic projection apparatus similar to FIG. 1, according to an embodiment.

FIG. 19 is essentially identical to the system of FIG. 1 and shown here again with certain portions enlarged and others omitted for convenience. FIGS. 1 and 19 depict an exemplary lithographic projection apparatus used in conjunction with the techniques described herein. The apparatus (e.g., see FIG. 19) comprises:
- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 19 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 19. However, in the case of a stepper (as opposed to a step-and-scan tool) the patterning device table MT may just be connected to a short stroke actuator, or may be fixed.

The depicted tool can be used in two different modes:
- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=1/4 or 1/5). In this manner, a relatively large target portion C can be exposed, without having to compromise on resolution.

Figure 20:
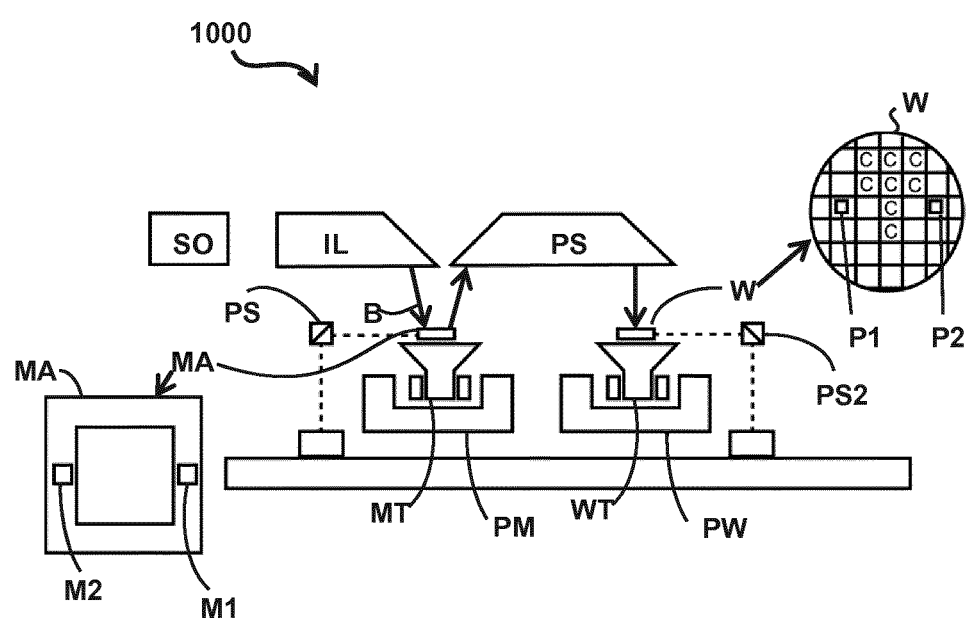
FIG. 20 is a schematic diagram of another lithographic projection apparatus, according to an embodiment.

FIG. 20 schematically depicts another exemplary lithographic projection apparatus 1000 in conjunction with the techniques described herein can be utilized.

The lithographic projection apparatus 1000 comprises:
a source collector module SO
an illumination system (illuminator) IL configured to condition a radiation beam B (e.g. EUV radiation).
a support structure (e.g. a patterning device table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 20, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 20, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 21:
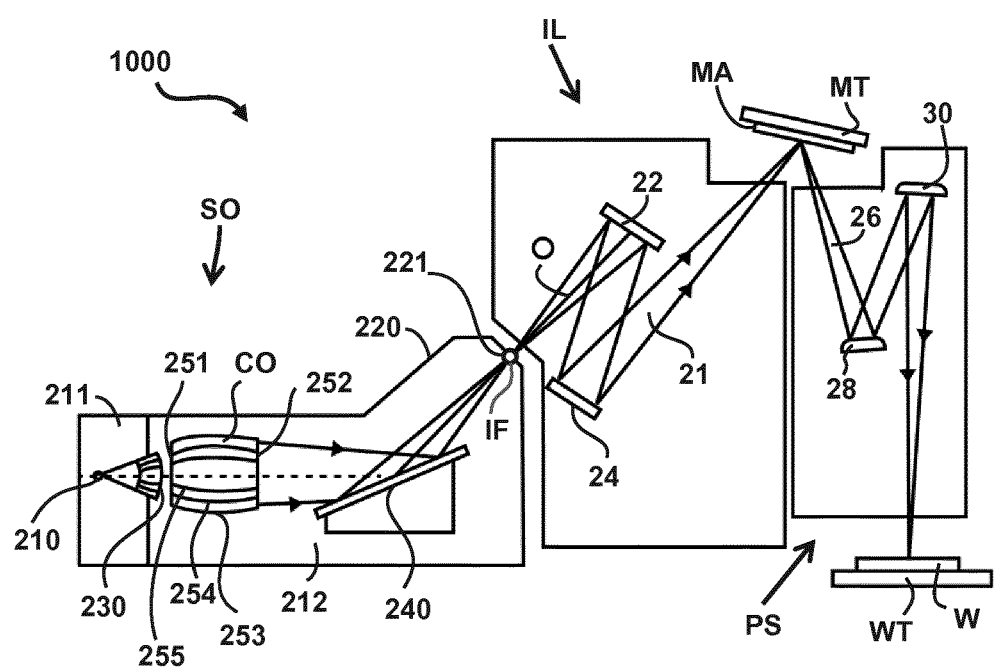
FIG. 21 is a more detailed view of the apparatus in FIG. 19, according to an embodiment.

FIG. 21 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 20.

Collector optic CO, as illustrated in FIG. 20, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 22:
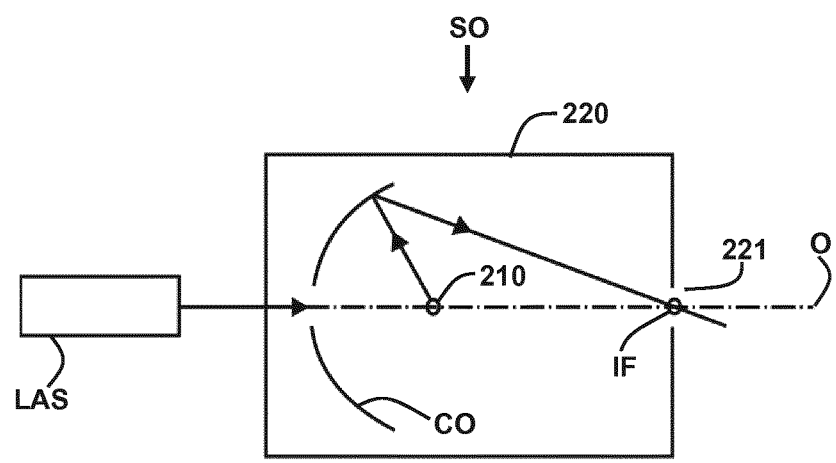
FIG. 22 is a more detailed view of the source collector module SO of the apparatus of FIG. 20 and FIG. 21, according to an embodiment.

Alternatively, the source collector module SO may be part of an LPP radiation system as shown in FIG. 22. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for determining a stack configuration for a substrate subjected a patterning process, the method comprising:
obtaining (i) measurement data of a stack configuration with location information on a printed substrate, (ii) a substrate model configured to predict a stack characteristic based on a location of the substrate, and (iii) a stack map including a plurality of stack configurations based on the substrate model;
determining, by a hardware computer system, values of model parameters of the substrate model based on a fitting between the measurement data and the plurality of stack configurations of the stack map; and
predicting, by the hardware computer system, an optimum stack configuration at a particular location based on the substrate model using the values of the model parameters.

2. The method of clause 1, wherein the substrate model includes one or more models corresponding to the stack characteristic of one or more layers of the substrate.

3. The method of any of clauses 1-2, wherein the substrate model is expressed in Cartesian coordinates having a first set of model parameters, and/or in polar coordinates having a second set of model parameters.

4. The method of clause 3, wherein the second set of model parameters is associated with Zernike polynomials.

5. The method of any of clauses 1-4, wherein the stack configuration comprises a plurality of layers of the substrate, wherein each layer is associated with the stack characteristics.

6. The method of any of clauses 1-5, wherein the stack characteristic is a thickness of a layer of the substrate, a critical dimension of a feature of the substrate, and/or a distance between adjacent features of the substrate.

7. The method of any of clauses 1-5, wherein the stack characteristic is a difference in a thickness of a layer and a selected thickness of the layer.

8. The method of clause 1, wherein the determining the values of the model parameters of the substrate model is an iterative process, an iteration comprising:
generating the stack map having the plurality of stack configurations based on simulation of the substrate model and a patterning process;
predicting intermediate values of model parameters based on an optimization algorithm; and
fitting the measurement data and the plurality of stack configurations of the stack map such that a cost function is reduced.

9. The method of clause 1, wherein the patterning process comprises a design for control process configured to automatically predict the stack configuration using the substrate model as perturbations.

10. The method of any of clauses 1 or 8, wherein the measurement data comprises a metrology recipe used for measurement of one or more stack characteristics of the stack configuration at the particular location on the substrate.

11. The method of clause 10, further comprising converting measurement data from a Cartesian coordinates to polar coordinates using Zernike based conversion model.

12. A method for determining optimum values of model parameters of a model configured to predict a characteristic of a patterning process, the method comprising:
obtaining (i) initial values including a starting point and a search region of the model parameters, (ii) measurement data corresponding to the characteristic of the patterning process, (iii) a predicted characteristic using the initial values of the model parameter and the measurement data, and (iv) an objective function, wherein the objective function comprises a first term related to a fit level, and a second term representing a penalty; and
determining, by a hardware computer system, the values of the model parameter based on the starting point, the search region, the fit level between the model and the measurement data such that the objective function is reduced.

13. The method of clause 12, wherein the characteristic of the patterning process is a stack characteristic.

14. The method of clause 13, wherein the stack characteristic is a substrate thickness, a thickness deviation, an overlay, and/or an alignment.

15. The method of any of clauses 13-14, wherein the model is a substrate model representing the stack characteristic.

16. The method of clause 15, wherein the substrate model has a parabolic form.

17. The method of any of clauses 12-16, wherein the search region is defined by a radius with the starting point as a center, wherein the radius is a distance from a center.

18. The method of any of clauses 12-17, wherein the fit level is a difference between a predicted characteristic and the measurement data.

19. The method of any of clauses 12-18, wherein determining the values of the model parameter is an iterative process, wherein an iteration comprises:

determining a number of sample points to be selected from the search region based on a number of model parameters and a size of the search region;

fitting the model and the measurement data based on the selected sample points;

determining a fit level based on the fitting;

evaluating the objective function comprising the fit level;

evaluating a fit quality based on the objective function; and updating the starting point and the search region based on the fit quality such that the objective function is reduced.

20. The method of clause 19, wherein the updating the starting point and the search region comprises selecting a new starting point and increasing the search region, in response to the fit quality breaching a first threshold.

21. The method of clause 19, wherein the updating the starting point and the search region comprises selecting a new starting point, in response to the fit quality breaching a second threshold.

22. The method of clause 19, wherein updating the starting point and the search region comprises decreasing a size of the search region, in response to the fit quality breaching a third threshold.

23. The method of clause 19, wherein the fitting is based on the objective function comprising a cost function of second order.

24. The method of any of clauses 12-23, wherein the objective function comprises:

a first penalty term configured to maintain a positive value of coefficients of second order terms of the cost function; and/or a second penalty term associated with a distance between predicted characteristic and the measurement data.

25. A computer program product comprising a non-transitory computer readable medium having instructions recorded thereon, the instructions when executed by a computer implementing the method of any of the above clauses.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A non-transitory computer-readable medium comprising instructions stored therein that, when executed by one or more processors, cause the one or more processors to at least:

obtain (i) initial values including a starting point and a search region of model parameters of a computer model configured to predict a characteristic of a patterning process, (ii) measurement data corresponding to the characteristic of the patterning process, (iii) a predicted characteristic using the initial values of the model parameter and the measurement data, and (iv) an objective function, wherein the objective function comprises a first term related to a fit level, and a second term representing a penalty; and determine values of the model parameters based on the starting point, the search region, and the objective function.

2. The medium of claim 1, wherein the characteristic of the patterning process is a stack characteristic, wherein the model is a substrate model representing the stack characteristic, and wherein the fit level is indicative of a difference between a predicted characteristic and the measurement data.

3. The medium of claim 2, wherein the stack characteristic is a substrate thickness, a thickness deviation, an overlay, and/or an alignment.

4. The medium of claim 1, wherein the instructions are further configured to cause the one or more processors to predict an optimum stack configuration at a particular location based on the substrate model using the values of the model parameters.

5. The medium of claim 2, wherein the substrate model includes one or more models corresponding to the stack characteristic of one or more layers of the substrate.

6. The medium of claim 4, wherein the substrate model has a parabolic form.

7. The medium of claim 1, wherein the search region is defined by a radius with a starting point as a center, wherein the radius is a distance from the center.

8. The medium of claim 1, wherein the instructions configured to cause the one or more processors to determine the values of the model parameters are further configured to cause the one or more processors to:

determine a number of sample points to be selected from the search region based on a number of model parameters and a size of the search region; and update the starting point and/or the search region based on the objective function.

9. The medium of claim 1, wherein the determination of the values of the model parameters comprises an iterative process, wherein an iteration comprises:

determination of a number of sample points to be selected from the search region based on a number of model parameters and a size of the search region;

fitting of the model and the measurement data based on the selected sample points;

determination of a fit level based on the fitting;

evaluation of the objective function comprising the fit level;

evaluation of a fit quality based on the objective function; and updating of the starting point and the search region based on the fit quality such that the objective function is reduced.

10. The medium of claim 9, wherein the updating of the starting point and the search region comprises selection of a new starting point and adjustment of the search region, in response to the fit quality breaching one or more thresholds.

11. The medium of claim 1, wherein the objective function comprises:

a first penalty term configured to maintain a positive value of coefficients of second order terms of the cost function; and/or a second penalty term associated with a distance between a predicted characteristic and the measurement data.

12. The medium of claim 1, wherein the determination of the values of the model parameters is an iterative process, wherein an iteration comprises:

generation of a stack map having a plurality of stack configurations based on simulation of the substrate model and a patterning process;

prediction of intermediate values of model parameters based on an optimization algorithm; and fitting of the measurement data and the plurality of stack configurations of the stack map such that a cost function is reduced.

13. The medium of claim 1, wherein the patterning process comprises a design for control process configured to automatically predict a stack configuration using the substrate model as perturbations.

14. The medium of claim 1, wherein the measurement data comprises a metrology recipe used for measurement of one or more stack characteristics of a stack configuration at a particular location on the substrate.

15. The medium of claim 1, wherein the instructions are further configured to cause the one or more processors to convert measurement data from a Cartesian coordinates to polar coordinates using a Zernike based conversion model.

16. A non-transitory computer-readable medium comprising instructions stored therein that, when executed by one or more processors, cause the one or more processors to at least:

obtain (i) measurement data of a stack configuration, with location information, for a substrate subjected to a patterning process, (ii) a substrate computer model configured to predict a stack characteristic based on a location associated with the substrate, and (iii) a stack map including a plurality of stack configurations based on the substrate model;

determine values of model parameters of the substrate model based on a fitting between the measurement data and the plurality of stack configurations of the stack map; and predict a stack configuration at a particular location based on the substrate model using the values of the model parameters.

17. The medium of claim 16, wherein the substrate model includes one or more models corresponding to the stack characteristic of one or more layers of the substrate.

18. The medium of claim 16, wherein the substrate model is expressed in Cartesian coordinates having a first set of model parameters, and/or in polar coordinates having a second set of model parameters.

19. The medium of claim 16, wherein the stack configuration comprises a plurality of layers of the substrate, wherein each layer is associated with a stack characteristic.

20. The medium of claim 16, wherein the stack characteristic is a thickness of a layer of the substrate, a critical dimension of a feature of the substrate, a distance between adjacent features of the substrate, and/or a difference between a thickness of a layer and a selected thickness of the layer.

* * * * *